(12) United States Patent
Poudeu-Poudeu et al.

(10) Patent No.: US 10,892,396 B2
(45) Date of Patent: Jan. 12, 2021

(54) STABILIZED COPPER SELENIDE THERMOELECTRIC MATERIALS AND METHODS OF FABRICATION THEREOF

(71) Applicant: The Regents of The University of Michigan, Ann Arbor, MI (US)

(72) Inventors: Pierre Ferdinand Poudeu-Poudeu, Ypsilanti, MI (US); Alan Olvera, Huntington Beach, CA (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/445,891

(22) Filed: Jun. 19, 2019

(65) Prior Publication Data
US 2020/0028052 A1  Jan. 23, 2020

Related U.S. Application Data

(60) Provisional application No. 62/686,893, filed on Jun. 19, 2018.

(51) Int. Cl.
| | |
|---|---|
| *H01L 37/00* | (2006.01) |
| *H01L 35/34* | (2006.01) |
| *H01L 35/26* | (2006.01) |
| *H01L 35/32* | (2006.01) |
| *H01L 35/16* | (2006.01) |

(52) U.S. Cl.
CPC .............. *H01L 35/26* (2013.01); *H01L 35/16* (2013.01); *H01L 35/32* (2013.01); *H01L 35/34* (2013.01)

(58) Field of Classification Search
CPC ......... H01L 35/26; H01L 35/34; H01L 35/32; H01L 35/16
See application file for complete search history.

(56) References Cited

U.S. PATENT DOCUMENTS

| | | |
|---|---|---|
| 3,095,330 A | 6/1963 | Epstein et al. |
| 8,692,106 B2 | 4/2014 | Willigan et al. |
| (Continued) | | |

OTHER PUBLICATIONS

Gahtori et al., "Giant enhancement in thermoelectric performance of copper selenide by incorporation of different nanoscale dimensional defect features," Nano Energy(2015) 13, 36-46 (Year: 2015).*

(Continued)

*Primary Examiner* — Angelo Trivisonno
(74) *Attorney, Agent, or Firm* — Harness, Dickey & Pierce, P.L.C.

(57) ABSTRACT

A thermoelectric composition is provided that includes a nanocomposite comprising a copper selenide ($Cu_2Se$) matrix having a plurality of nanoinclusions comprising copper metal selenide ($CuMSe_2$) distributed therein. M may be selected from the group consisting of: indium (In), aluminum (Al), gallium (Ga), antimony (Sb), bismuth (Bi), and combinations thereof. The thermoelectric composition has an average figure of merit (ZT) of greater than or equal to about 1.5 at a temperature of less than or equal to about 850K (about 577° C.). Methods of making such a thermoelectric nanocomposite material by a sequential solid-state transformation of a $CuSe_2$ precursor are also provided.

17 Claims, 13 Drawing Sheets

(56) References Cited

U.S. PATENT DOCUMENTS

Figure 1:
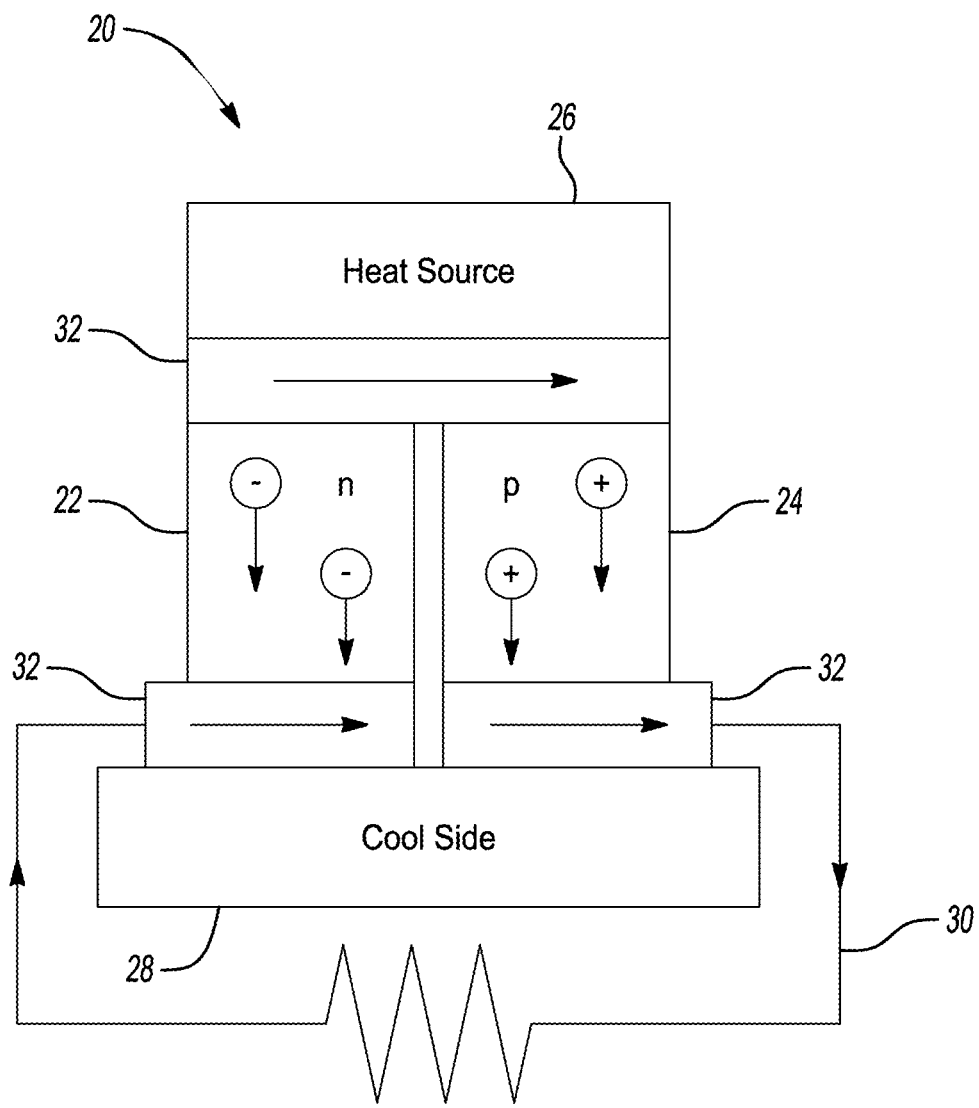

2009/0235969 A1 9/2009 Heremans et al.
2016/0308107 A1 10/2016 Talapin et al.

OTHER PUBLICATIONS

Butt et al., "Enhanced Thermoelectricity in High-Temperature (β-Phase Copper(I) Selenides Embedded with Cu2Te Nanoclusters," ACS Appl. Mater. Interfaces 2016, 8, 15196-15204 (Year: 2016).*

Brown, David R. et al., "Chemical Stability of (Ag,Cu)2Se: a Historical Overview," Journal of Electronic Materials 42 (7), pp. 2014-2019 (Published Online: Mar. 12, 2013).

Jin, Yingshi et al., "Na-Doping Effects on Thermoelectric Properties of Cu2-xSe Nanoplates," Appl. Sci. 8, 12 (Published Dec. 22, 2017); DOI: 10.3390/app8010012.

Mallick, Mofasser et al., "Realizing high figure-of-merit in Cu2Te using a combination of doping, hierarchical structure, and simple processing," Journal of Applied Physics 122, 024903; (Published online: Jul. 13, 2017) DOI: 10.1063/1.4993900.

Nunna, Raghavendra et al., "Ultrahigh thermoelectric performance in Cu2Se-based hybrid materials with highly dispersed molecular CNTs," Energy Environ. Sci. 2017, 10, pp. 1928-1935 (Published Jul. 27, 2017); DOI: 10.1039/c7ee01737e.

Olvera, A. A. et al., "Partial indium solubility induces chemical stability and colossal thermoelectric figure of merit in Cu2Se," Energy Environ. Sci., 2017, 10, pp. 1668-1676; DOI: 10.1039/c7ee01193h (Published Jun. 19, 2017).

Park, J.S. et al., "CuInSe2 phase formation during Cu2Se2/In2Se3 interdiffusion reaction," Journal of Applied Physics 87 (8), pp. 3683-3690 (Published Apr. 15, 2000).

Wada, Takahiro et al., "Growth of CuInSe2 crystals in Cu-rich Cu—In—Se thin films," Journal of Materials Research, 12 (6), Jun. 1997, pp. 1456-1462 (Abstract Only).

Dennler, Giles et al., "Are Binary Copper Sulfides/Selenides Really New and Promising Thermoelectric Materials?" Advanced Energy Materials, 4 (9) 13015841 (Published Feb. 12, 2014); DOI: 10.1002/aenm.201301581.

Qiu, Pengfei et al., "Sulfide bornite thermoelectric material: a natural mineral with ultralow thermal conductivity," Energy Environ. Sci., 2014, 7, pp. 4000-4006 (Published Oct. 10, 2014); DOI: 10.1039/c4ee02428a.

* cited by examiner

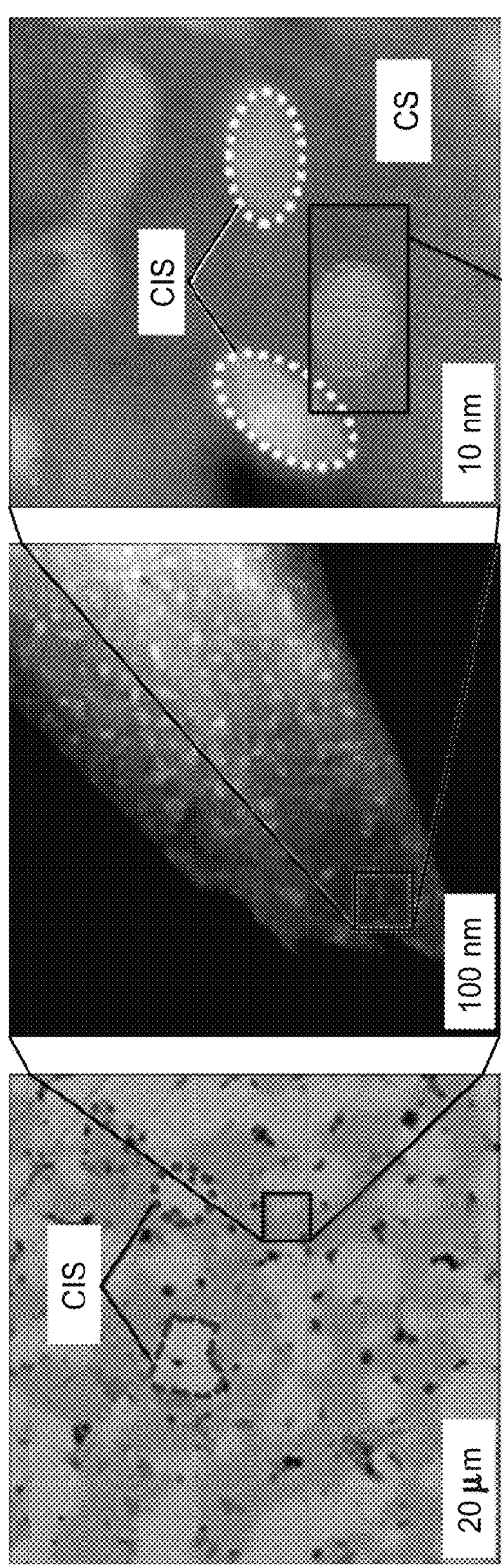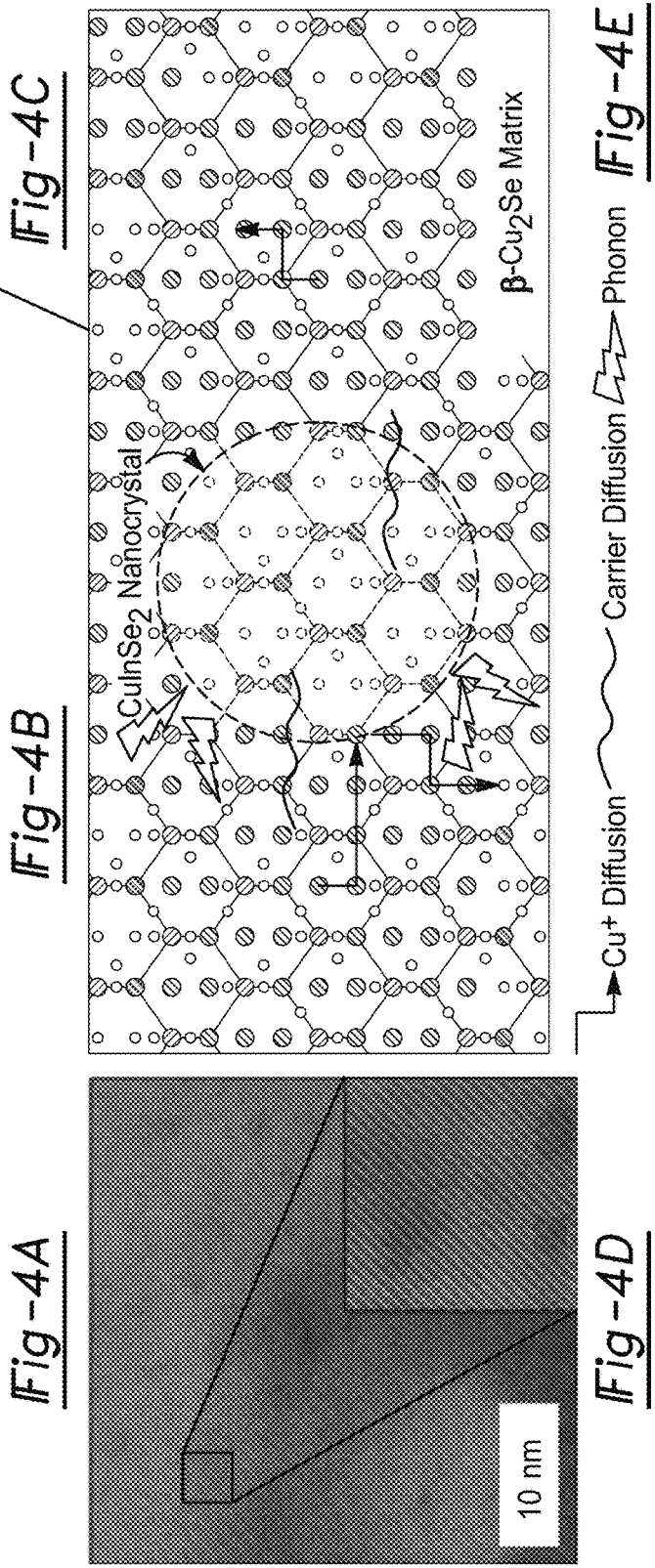

STABILIZED COPPER SELENIDE THERMOELECTRIC MATERIALS AND METHODS OF FABRICATION THEREOF

CROSS-REFERENCE TO RELATED APPLICATIONS

This application claims the benefit of U.S. Provisional Application No. 62/686,893, filed on Jun. 19, 2018. The entire disclosure of the above application is incorporated herein by reference.

GOVERNMENT SUPPORT

This invention was made with government support under DE-SC0008574 awarded by the Department of Energy. The Government has certain rights in the invention.

FIELD

The present disclosure relates to stabilized copper selenide nanocomposite thermoelectric materials and methods of fabrication of such thermoelectric materials.

BACKGROUND

This section provides background information related to the present disclosure which is not necessarily prior art.

A thermoelectric effect refers to direct conversion of a difference in temperature to electric voltage within a thermocouple. The effect can be a result of the temperature gradient causing charge carriers within the material to diffuse from the hot side to the cold side. The effect is useful in the generation of electricity, to measure temperature changes, and in temperature control devices, including for refrigeration. The Seebeck effect, which refers to the direct conversion of heat into electricity at the junction of distinct materials, is the atomic driving force for devices known as thermoelectric generators. Thermoelectric generators are devices that utilize the Seebeck effect in order to generate electricity from heat. The inverse is the Peltier effect, in which the flow of a current between the junction of two distinct materials may cause a release or absorption of heat and has found use in the refrigeration industry. As used herein, a thermoelectric device is one that has a thermoelectric material that can exhibit the Seebeck or Peltier effects for thermoelectric energy conversion.

Thermoelectric materials for use in such thermoelectric devices are typically evaluated on the basis of a Figure of Merit ($ZT=S^2\sigma T/\kappa_{total}$ where S is Seebeck coefficient, $\sigma$ is electrical conductivity, T is absolute temperature, and $\kappa_{total}$ is total thermal conductivity), which takes into account the thermal conductivity, electrical conductivity, and the Seebeck coefficient, which relates voltage and temperature and depends upon the identity of the material, at a specific temperature. The Figure of Merit improves with enhanced electrical conductivity and Seebeck coefficients and poor thermal conductivity. Poor thermal conductivity leads to a greater temperature differential across the material, which improves efficiency. An average Figure of Merit/ZT value is typically defined for operating temperature ranges to provide an assessment of the thermoelectric material over expected operating conditions. Commonly used thermoelectric materials have ZT values around 1 at temperatures of 500-700 K. However, to achieve efficiencies comparable to other power generation methods, higher ZT values, for example at about 2-3, would be advantageous.

The lack of thermal and chemically stable lead-free high efficient thermoelectric materials having such figures of merit has hampered wide spread deployment of thermoelectric energy conversion technology, which has largely remained within a small sphere of niche applications. Therefore, recent trends in thermoelectric research have focused on the development of low-cost, high-performance materials from earth-abundant and environmentally friendly elements, such as copper chalcogenide-based materials. However, due to their intrinsic chemical instability at relatively high temperatures there has been little advancement in the application of many of these materials, including $Cu_2Se$, which is well known for its high figure of merit (ZT) value, but poor chemical stability. New high performance, stable thermoelectric materials primarily formed of earth abundant materials would be desirable for use in the next generation of thermoelectric devices.

SUMMARY

This section provides a general summary of the disclosure, and is not a comprehensive disclosure of its full scope or all of its features.

In certain aspects, the present disclosure provides a thermoelectric composition comprising a nanocomposite comprising a copper selenide ($Cu_2Se$) matrix having a plurality of nanoinclusions comprising copper metal selenide ($CuMSe_2$) distributed therein, wherein M is selected from the group consisting of: indium (In), aluminum (Al), gallium (Ga), antimony (Sb), bismuth (Bi), and combinations thereof. The thermoelectric composition has an average figure of merit (ZT) of greater than or equal to about 1.5 at a temperature of less than or equal to about 850K (about 577° C.).

In one aspect, M is indium and the copper metal selenide comprises $CuInSe_2$, so that the nanocomposite is represented by $(1-x)Cu_2Se/(x)CuInSe_2$, wherein x is greater than or equal to about 0.005 to less than or equal to about 0.1.

In one aspect, the thermoelectric composition has a maximum figure of merit (ZT) of greater than or equal to about 2 at a temperature of less than or equal to about 850K (about 577° C.).

In one aspect, x is greater than or equal to about 0.005 and less than or equal to about 0.03.

In one aspect, x is about 0.01.

In one aspect, the nanocomposite comprises M at greater than or equal to about 0.5 mol. % to less than or equal to about 10 mol. %.

In one aspect, the nanocomposite comprises M at greater than or equal to about 0.5 mol. % to less than or equal to about 3 mol. %.

In one aspect, the plurality of nanoinclusions further comprises $Cu_{4-y}Ag_ySe_2$, where y is greater than 0 and less than 4.

In other aspects, the present disclosure provides a thermoelectric device comprising a thermoelectric component comprising a thermoelectric nanocomposite composition comprising a copper selenide ($Cu_2Se$) matrix having a plurality of nanoinclusions comprising copper metal selenide ($CuMSe_2$) distributed therein. M may be selected from the group consisting of: indium (In), aluminum (Al), gallium (Ga), antimony (Sb), bismuth (Bi), and combinations thereof. The thermoelectric nanocomposite composition has an average figure of merit (ZT) of greater than or equal to about 1.5 at a temperature of less than or equal to about 850K (about 577° C.). The thermoelectric component may comprise at least two electrodes, a hot side region, and a cold side region.

In one aspect, the thermoelectric device is used as a power source for a device selected from the group consisting of: a wearable electronic device, an implantable electronic device, a vehicle, an industrial facility, a nuclear power plant, a manufacturing facility, a submarine, a remote power generator, a radioisotope thermal generators (RTG), and combinations thereof.

In other aspects, a method of making a thermoelectric composition comprises converting a precursor comprising copper diselenide ($CuSe_2$) into copper selenide ($Cu_2Se$) and copper metal selenide ($CuMSe_2$). The method includes reacting the precursor with a reagent metal (M') and a metal (M) selected from the group consisting of: indium (In), aluminum (Al), gallium (Ga), antimony (Sb), bismuth (Bi), and combinations thereof to form a nanocomposite. In certain aspects, the reagent metal (M') is selected from the group consisting of: copper (Cu), silver (Ag), and combinations thereof. The nanocomposite comprises a matrix of the copper selenide ($Cu_2Se$) having a plurality of nanoinclusions comprising the copper metal selenide ($CuMSe_2$) distributed therein. The nanocomposite has an average figure of merit (ZT) of greater than or equal to about 1.5 at a temperature of less than or equal to about 850K (about 577° C.).

In one aspect, the reagent metal (M') comprises copper (Cu) and silver (Ag).

In one aspect, the converting is a sequential solid-state transformation of the precursor, wherein the reagent metal (M') comprises copper (Cu) and M comprises indium (In) and a $(1-x)CuSe_2/(x)CuInSe_2$ nanocomposite is made via a partial transformation of the $CuSe_2$ in the precursor via a first reaction represented by:

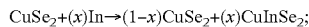

adding the reagent metal (M') comprising copper (Cu) to the products of the first reaction to transform remaining copper diselenide ($CuSe_2$) into copper selenide ($Cu_2Se$) via a second reaction represented by:

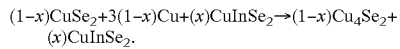

In one aspect, M is indium (In) that is added to the precursor comprising $CuSe_2$ at greater than or equal to about 0.5 mol. % to less than or equal 10 mol. %.

In one further aspect, indium (In) is added to the precursor comprising $CuSe_2$ at about 1 mol. %.

In one aspect, the converting is a sequential solid-state transformation of the precursor, wherein M is indium (In) that is added to the precursor comprising $CuSe_2$ in a ball mill under an inert atmosphere to generate $CuInSe_2$, and the reagent metal (M') comprises elemental copper (Cu) added to convert remaining copper diselenide ($CuSe_2$) to copper selenide ($Cu_2Se$) to form a product comprising a mixed powder comprising copper selenide ($Cu_2Se$) and copper indium selenide ($CuInSe_2$).

In one aspect, mixed powder is removed from the ball mill and compressed into high density pellets.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a schematic showing an exemplary basic unit of a thermoelectric generator system, namely the thermoelectric module, which contains two dissimilar thermoelectric materials (positively charged, p-type, and negatively charged, n-type), electrodes, as well as hot and cold sides. A current flows in this circuit when there is a temperature differential from one side of the module to the other, with current magnitude generally correlated with the amplitude of the temperature difference.

Figure 2A:
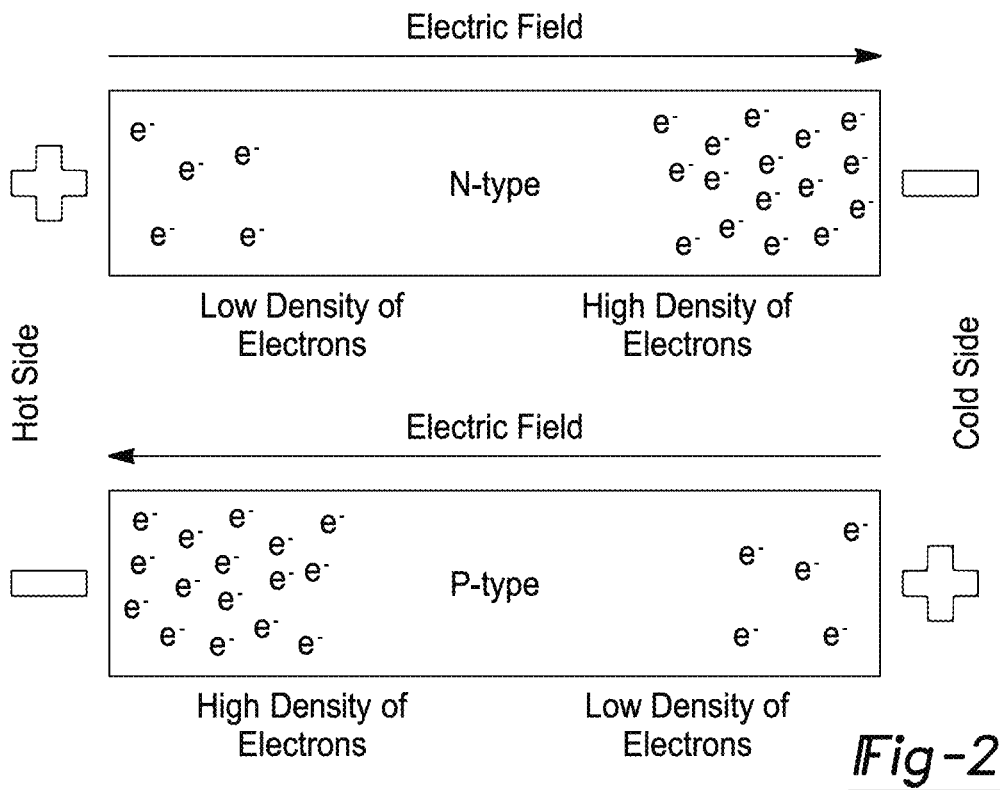
Figure 2B:
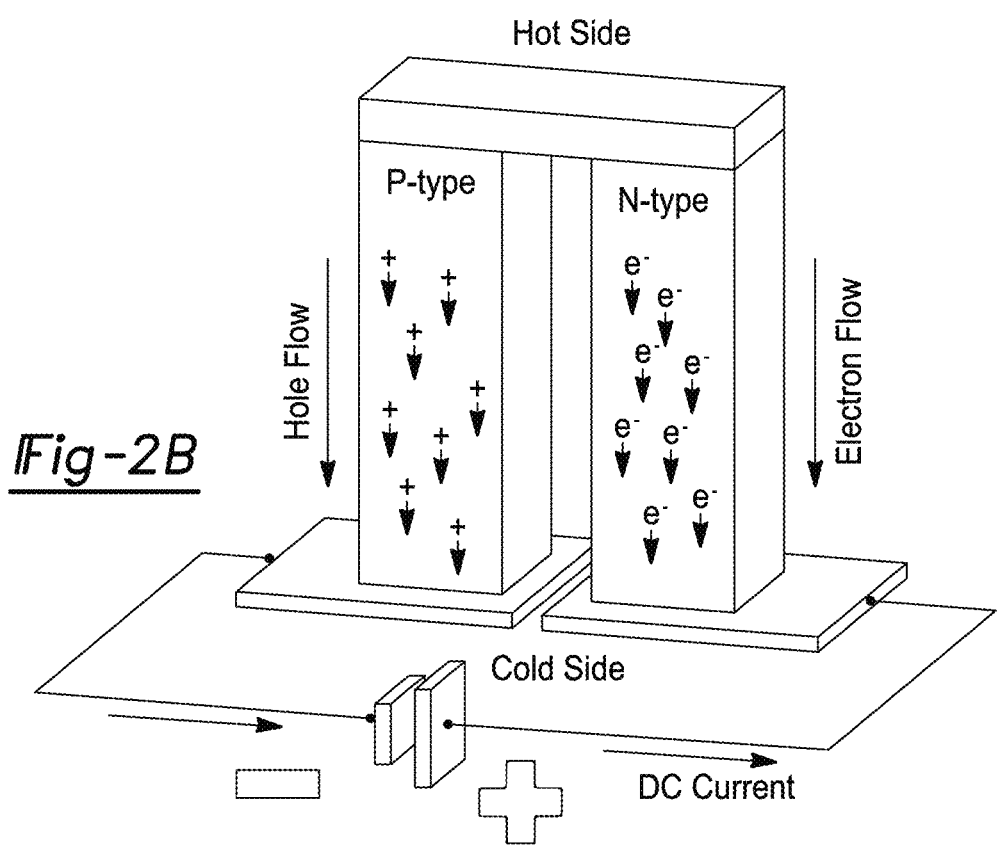

FIGS. 2A-2B are schematics showing exemplary thermoelectric device operation. FIG. 2A shows a schematic of migration of charge carriers, holes (antielectrons) and electrons, in a material with an applied thermal gradient representing the Seebeck effect for both n-type (electrons as the majority charge carriers) and p-type (holes as the majority charge carriers). FIG. 2B shows an illustration of a practical application of Seebeck effect in a thermoelectric device including n-type and p-type legs.

Figure 3:
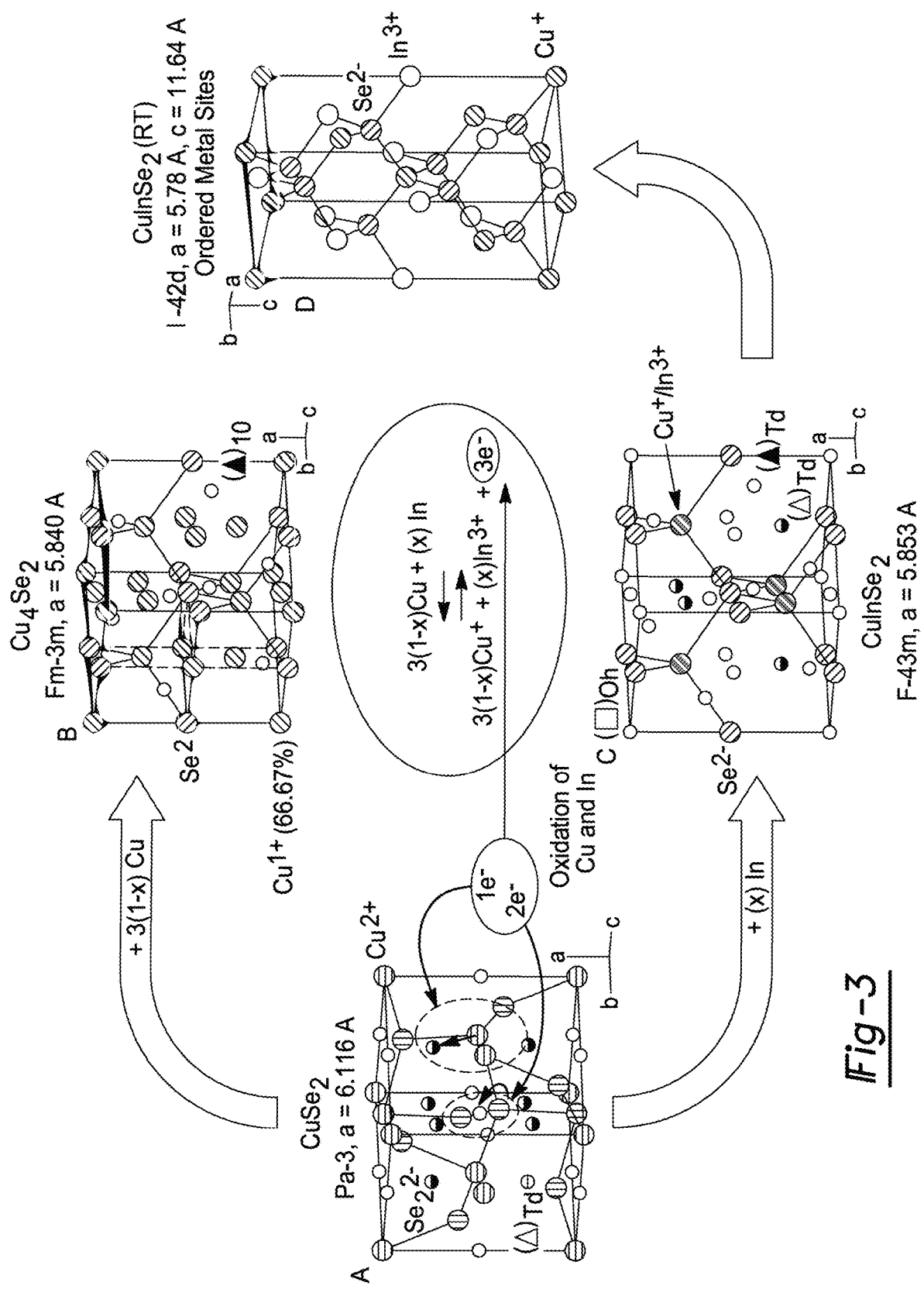

FIG. 3 shows a schematic illustration of the solid-state transformation of the $CuSe_2$ template into $(1-x)Cu_2Se/(x)CuInSe_2$ nanocomposites. Label A shows a cubic structure of the $CuSe_2$ template. Label B shows a cubic structure of b-$Cu_2Se$ (CS). Label C shows a cubic structure (Zinc Blende) of $CuInSe_2$ (CIS). Label D shows a room temperature tetragonal structure of $CuInSe_2$. The transformation of one mole of the $CuSe_2$ template into either CS or CIS requires the supply of $3e^-$, which can be provided by the addition of one mole of elemental In or three moles of elemental Cu into the starting mixture.

FIGS. 4A-4E show a hierarchical microstructure of CS/CIS composites. FIG. 4A shows a backscattered electron image of 50% CS/50% CIS composite showing the microscale interweaving network of CS and CIS phases. FIG. 4B shows a HAADF-STEM image of the CS/CIS composite with 50 mol. % CIS showing the formation of widely dispersed nanoinclusions of CIS, with particle sizes below 10 nm, within the CS matrix. FIG. 4C shows high magnification image of the CS/CIS interfaces. FIG. 4D shows a schematic illustration of the atomic structure of the CS/CIS composite showing a nanocrystal of CIS coherently embedded in the CS matrix. The similarity in the packing of $Se^{2-}$ anions in both CS and CIS facilitate the formation of coherent CS/CIS interfaces. Such coherent interfaces assist the carrier transport across the interface, while inhibiting phonon transport and diffusion of Cu+ ions owing to the difference in the lattice vibration and the degree of Cu disorder between CS and CIS. FIG. 4E shows STEM of the sample containing 1 mol. % In (x=0.01), showing homogenous well-ordered atomic structure. The lack of a second phase suggests the solubility of In within the $Cu_2Se$ lattice.

Figure 5A:
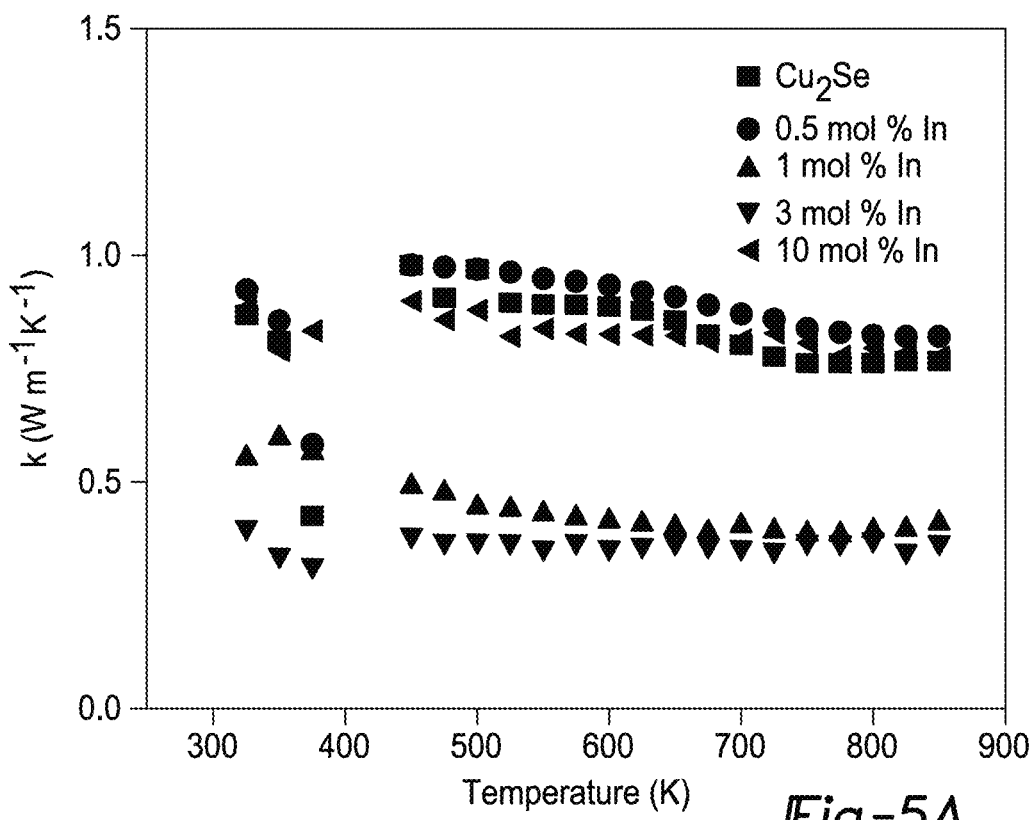
Figure 5B:
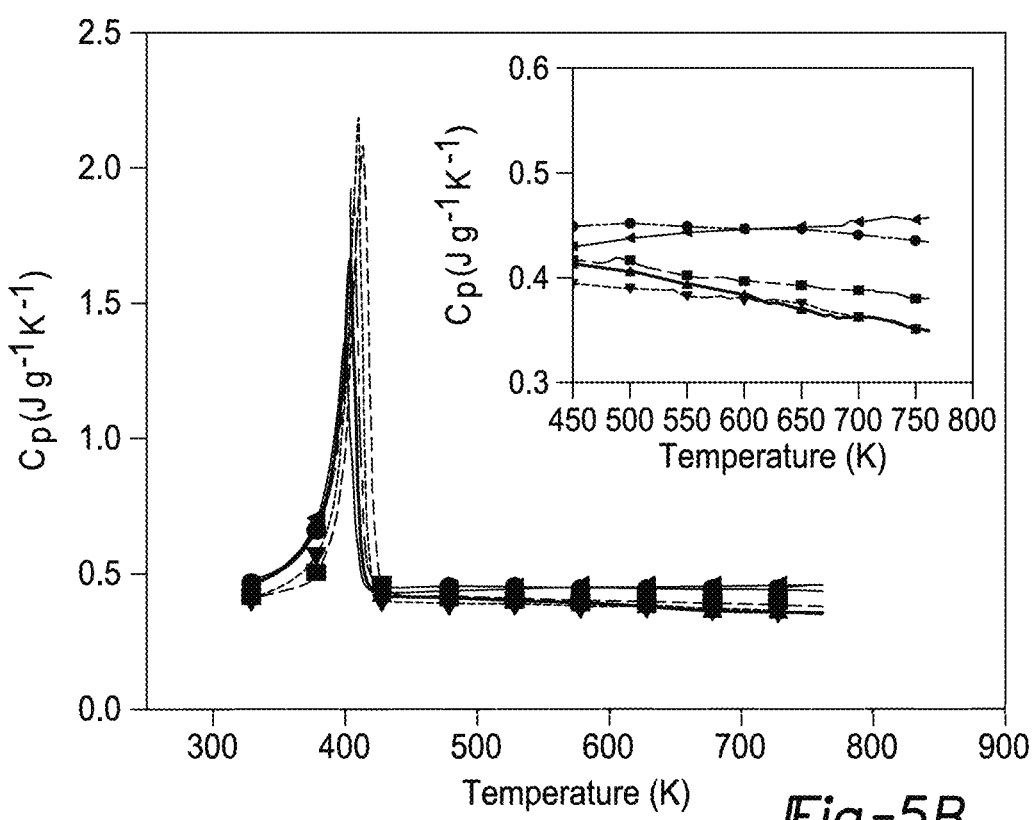

FIGS. 5A-5B show thermal properties of $Cu_2Se$ samples containing various mole fractions of indium. FIG. 5A shows temperature dependent thermal conductivity and FIG. 5B shows specific heat capacity.

Figure 6A:
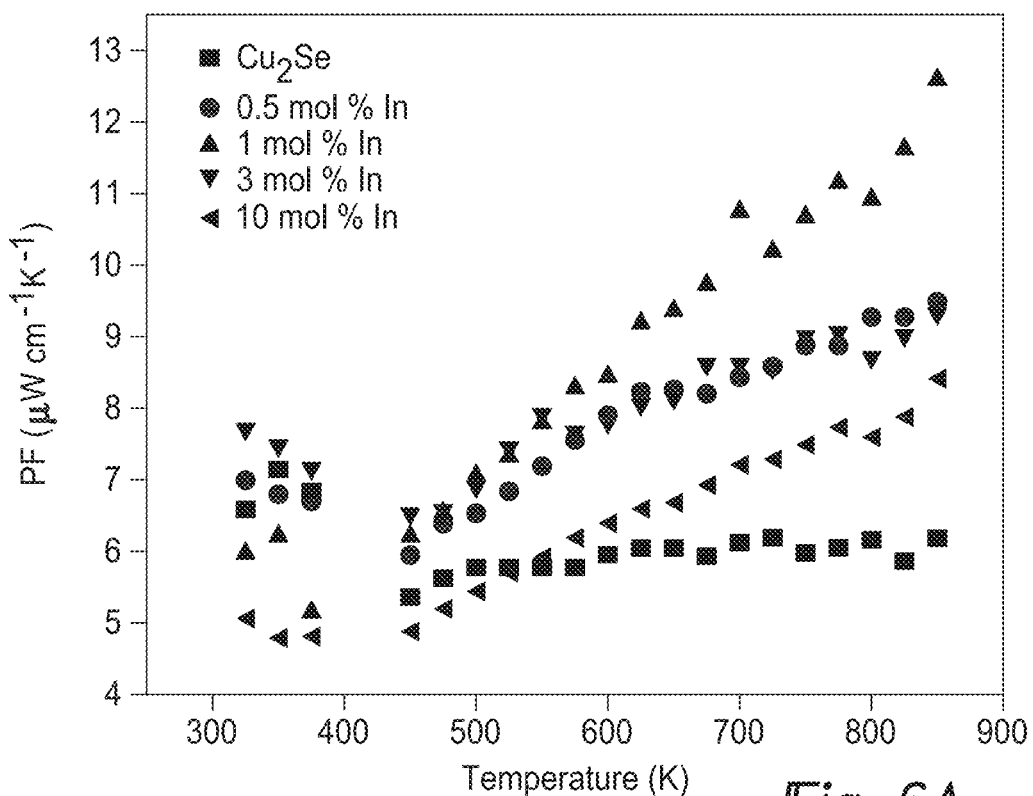
Figure 6B:
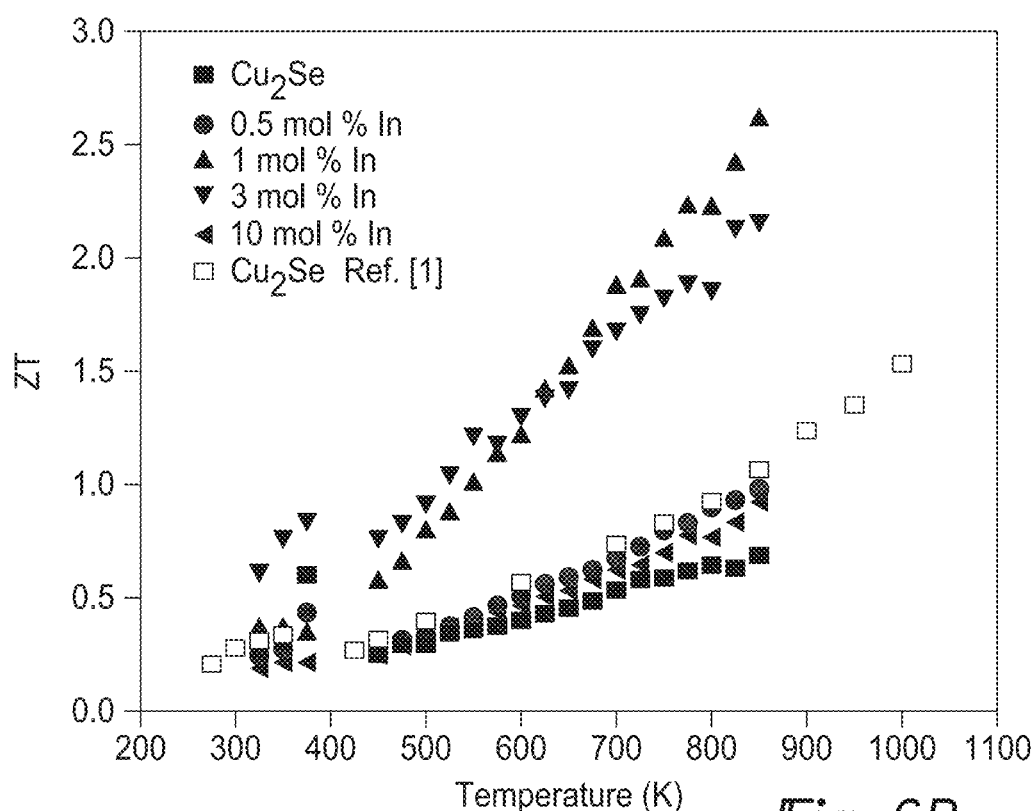

FIGS. 6A-6B show power factors and Figures of Merit (ZT) values. FIG. 6A shows temperature dependence of the Power Factor (PF), $\sigma^2 S$, of $(1-x)CS/(x)CIS$ composites. FIG. 6B shows temperature dependence of the figure of merit, ZT, of $(1-x)CS/(x)CIS$ composites compared to values reported for $Cu_2Se$.

Figure 7:
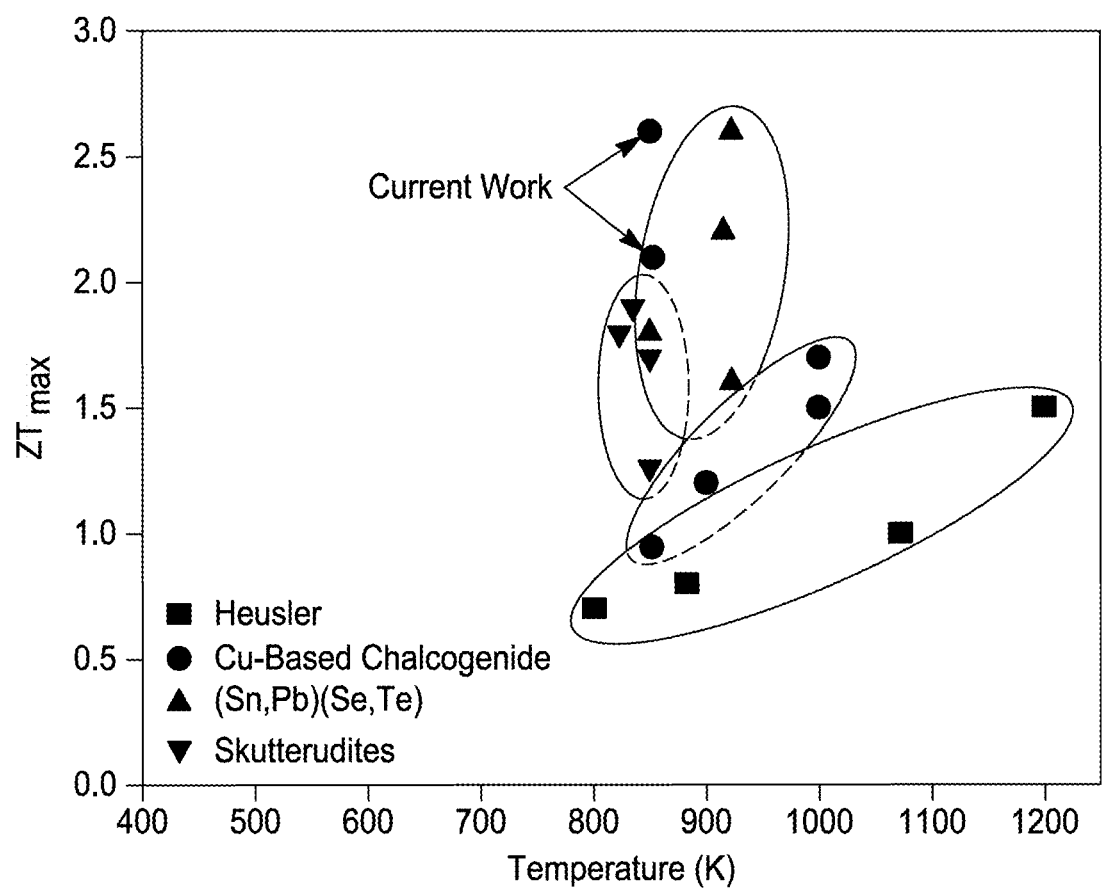

FIG. 7 shows a comparison of highest reported Figures of Merit ZT ($ZT_{max}$) among state-of-the-art thermoelectric materials in the half-Heusler compounds, Cu-based chalcogenides, (Sn,Pb)(Se,Te) compounds, and Skutterudites. Assigned temperature corresponds to the temperature at which maximum ZT was obtained.

Figure 8A:
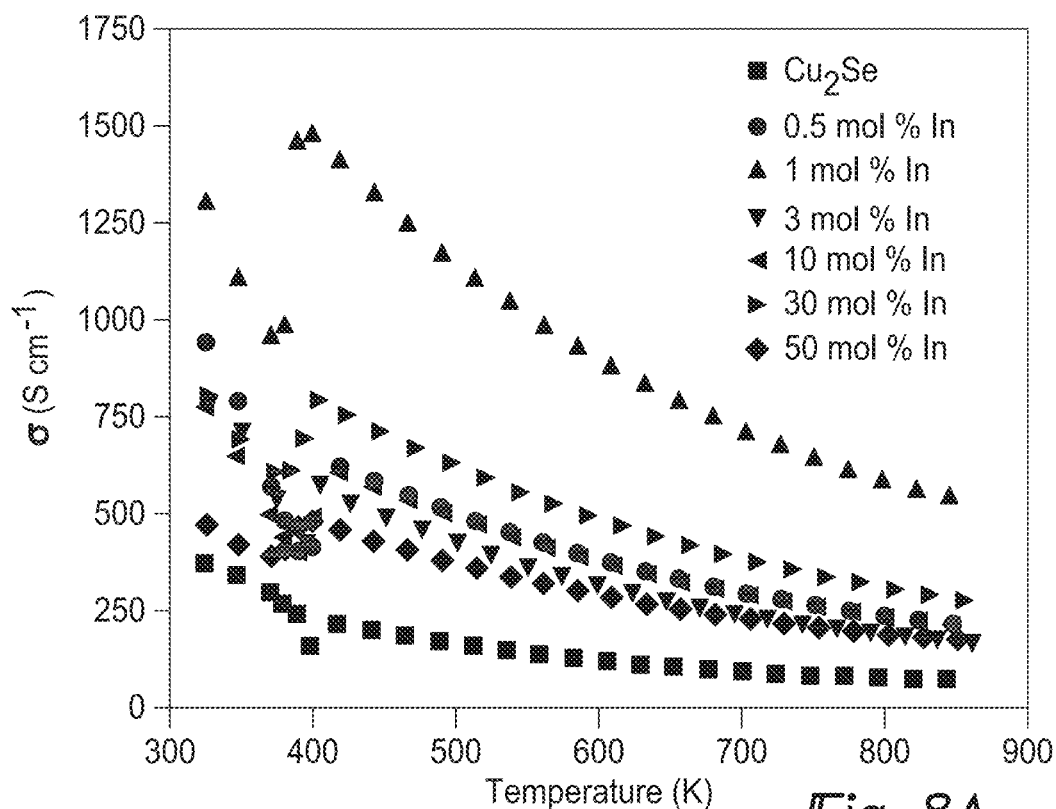
Figure 8B:
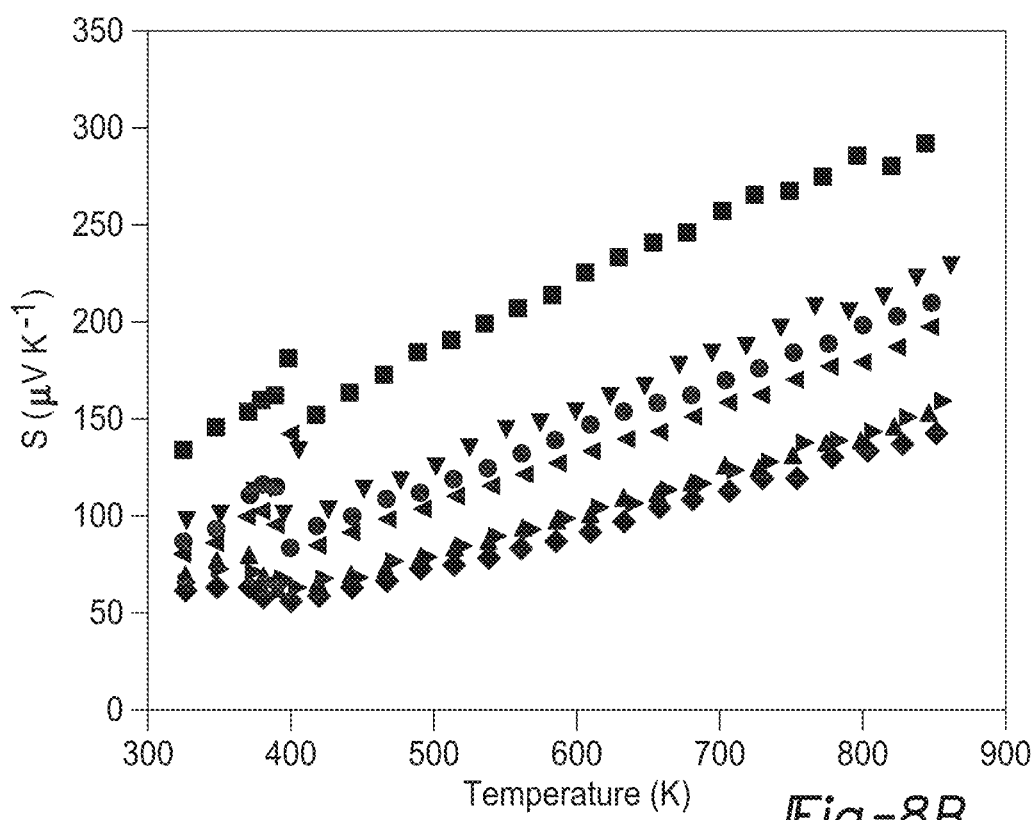
Figure 8C:
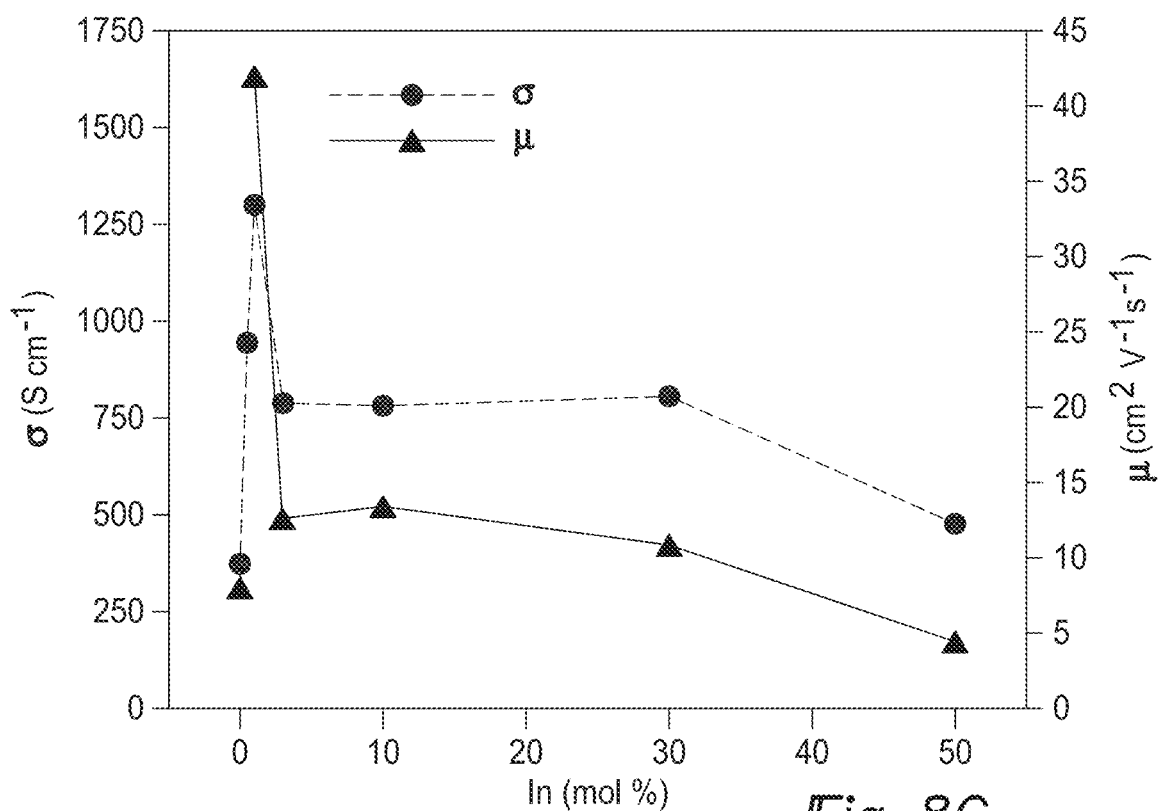
Figure 8D:
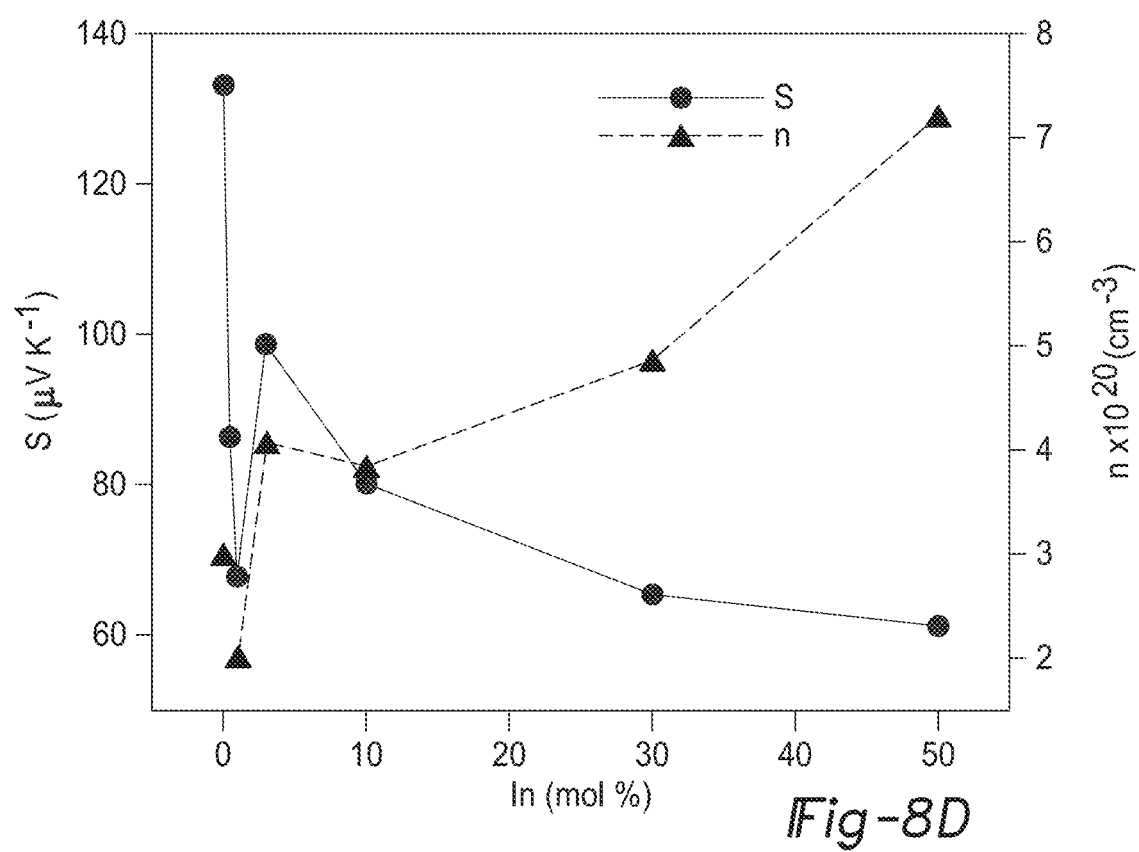

FIGS. 8A-8D. Electronic properties of $Cu_2Se$ samples containing various mole fractions of indium up to 50 mol. % In. FIG. 8A shows temperature dependent electrical conductivity. FIG. 8B shows temperature dependent Seebeck coefficient. FIG. 8C shows effect of In content on electrical conductivity and carrier mobility. FIG. 8D shows effect of In content on Seebeck coefficient and carrier density.

Figure 9A:
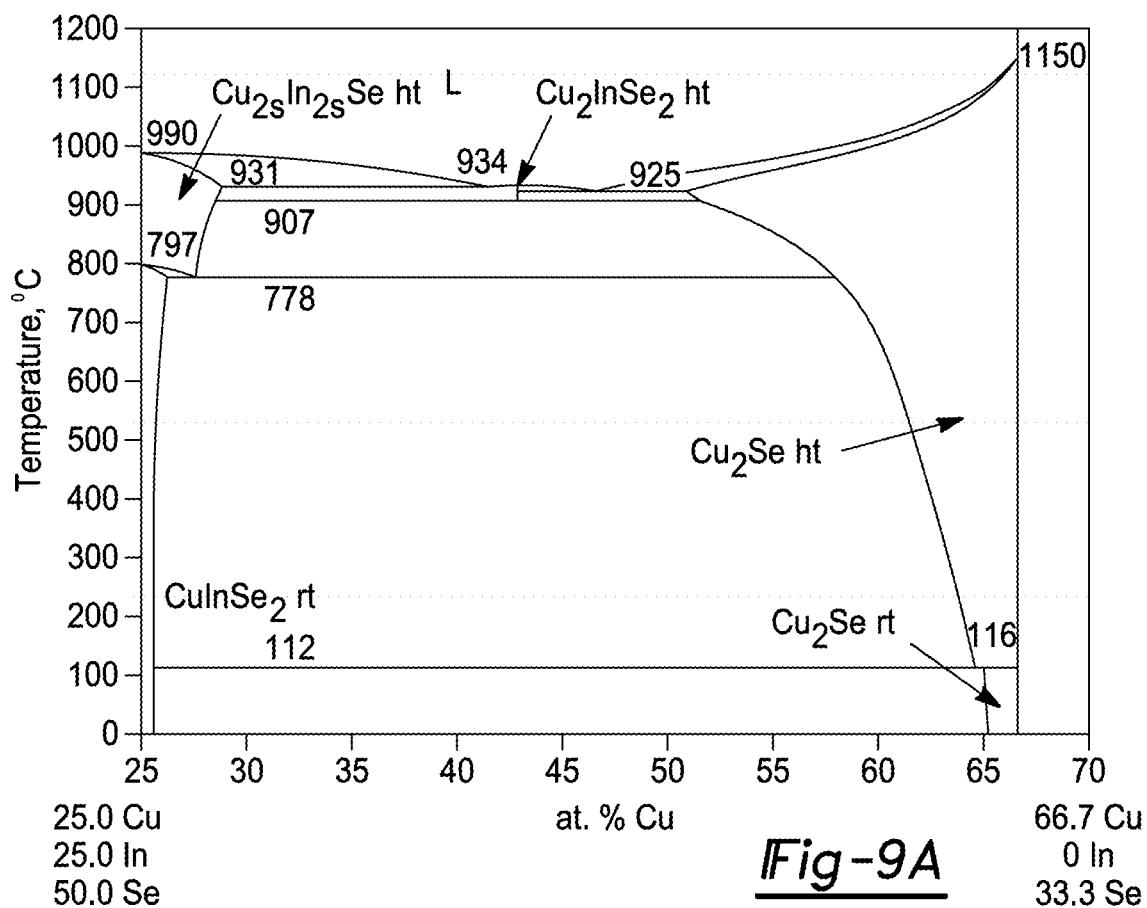
Figure 9B:
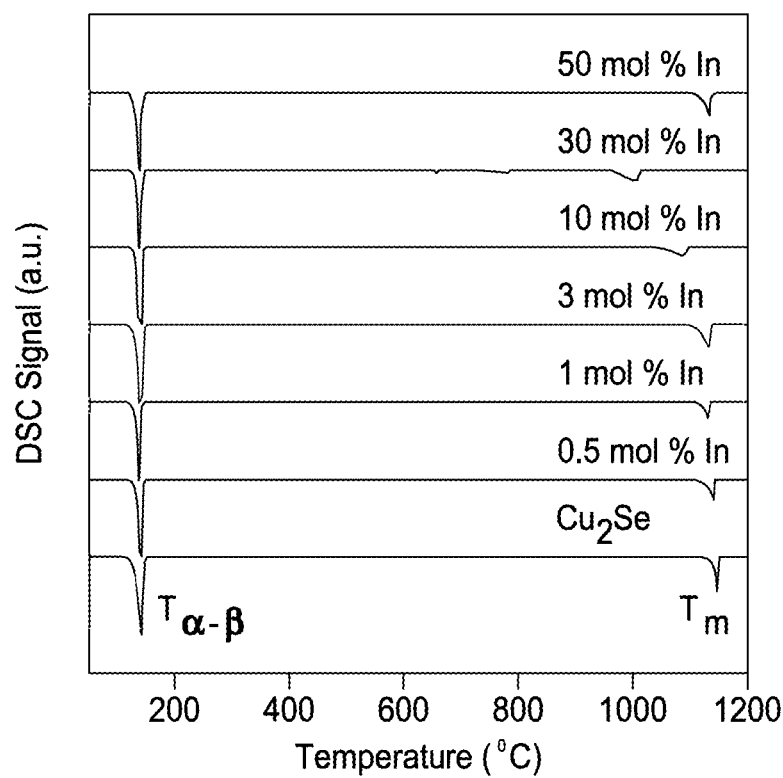

FIGS. 9A-9B show a $Cu_2Se$—$CuInSe_2$ phase diagram and DSC of $(1-x)Cu_2Se/(x)CuInSe_2$ samples. FIG. 9A shows an experimental phase diagram of pseudo binary system $Cu_2Se$—$CuInSe_2$. At low concentrations of indium, $Cu_2Se$ becomes a better solvent for indium as a function of temperature. It should be noted that the $Cu_2Se$ α-to-β transition temperature is predicted to remain constant for any multi-component $Cu_2Se$—$CuInSe_2$ composition. This is confirmed by differential scanning calorimetry (DSC) measurements in FIG. 9B for all $(1-x)Cu_2Se/(x)CuInSe_2$ samples, and it shows that the α-to-β transition temperature remains at approximately 400 K. The melting temperature of the $Cu_2Se$ matrix in various $(1-x)Cu_2Se/(x)CuInSe_2$ composites gradually decreases with the increasing CIS content for samples with x≤0.3. This is believed to be due to the intimate mixing in these composites between the high melting $Cu_2Se$ matrix and the lower melting CIS phase. Endothermic is down.

Figure 10A:
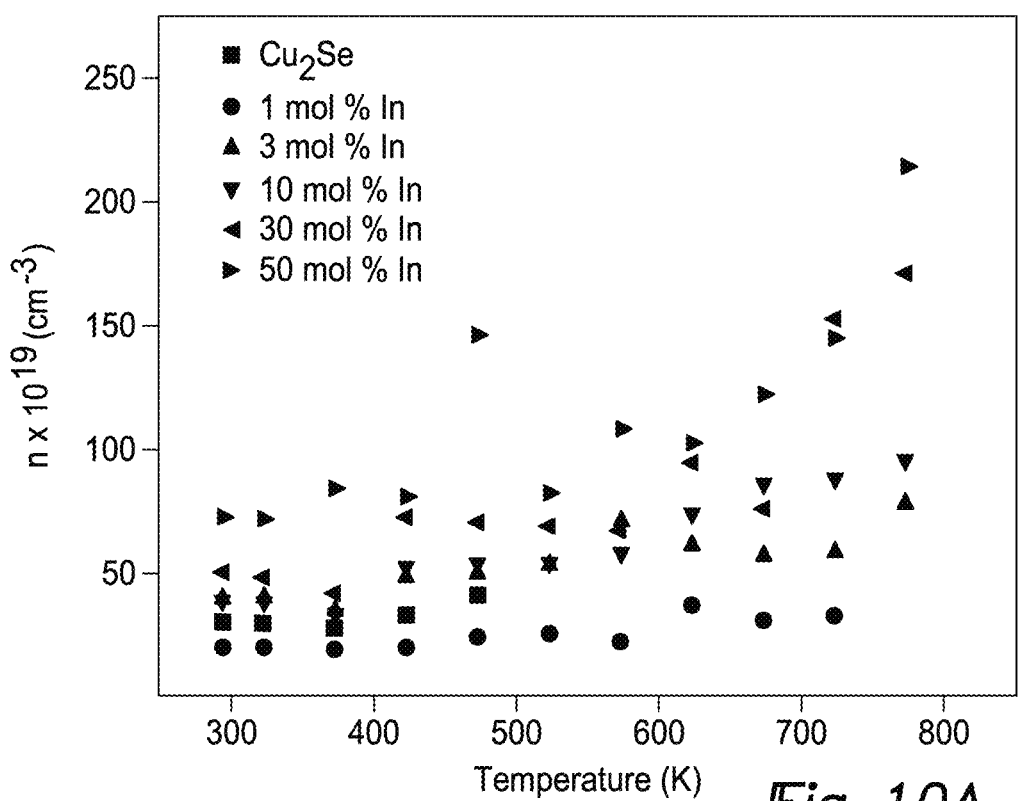
Figure 10B:
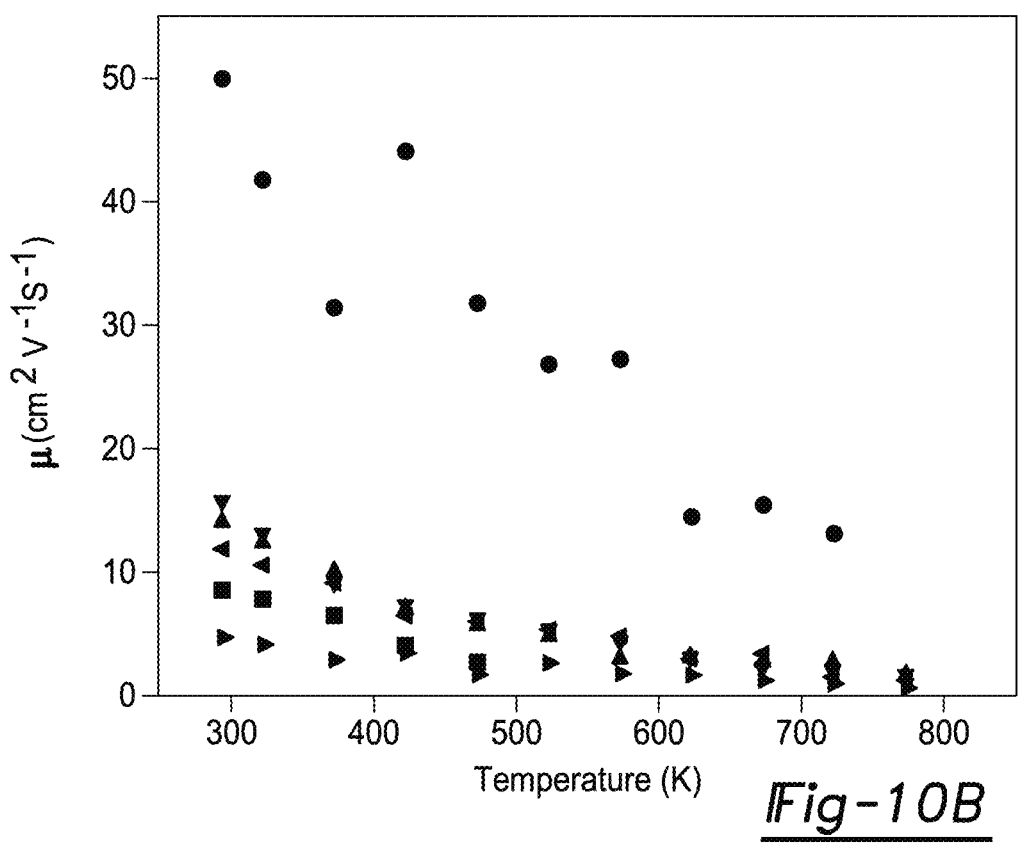
Figure 10C:
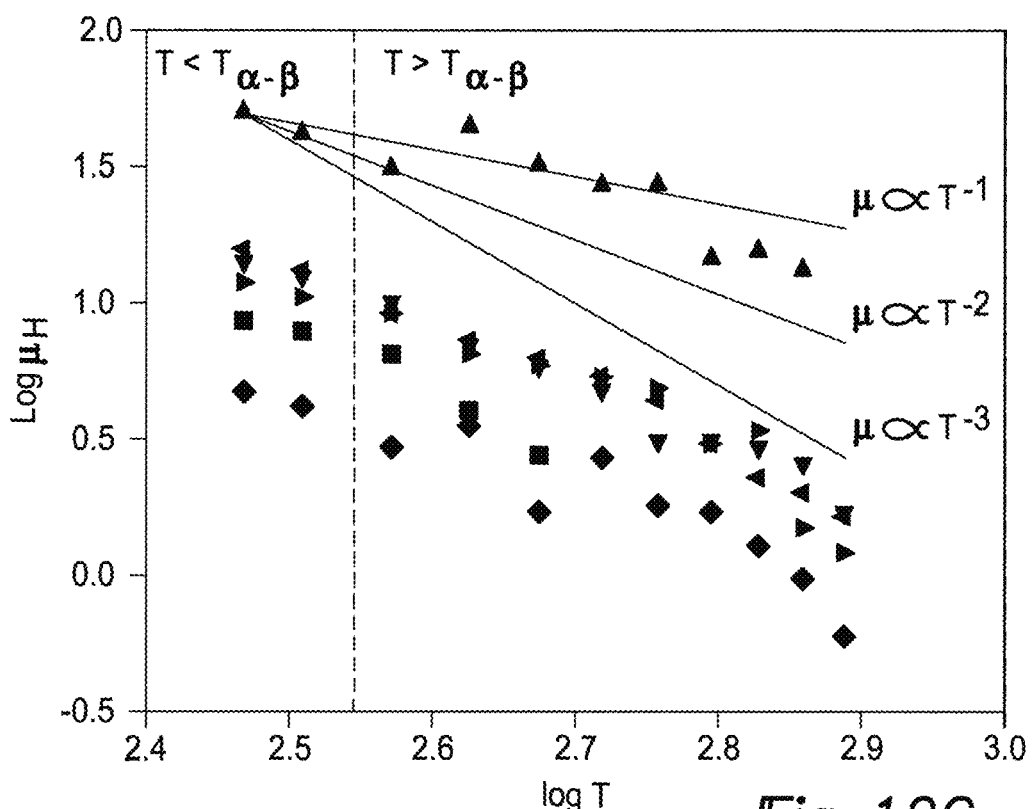
Figure 10D:
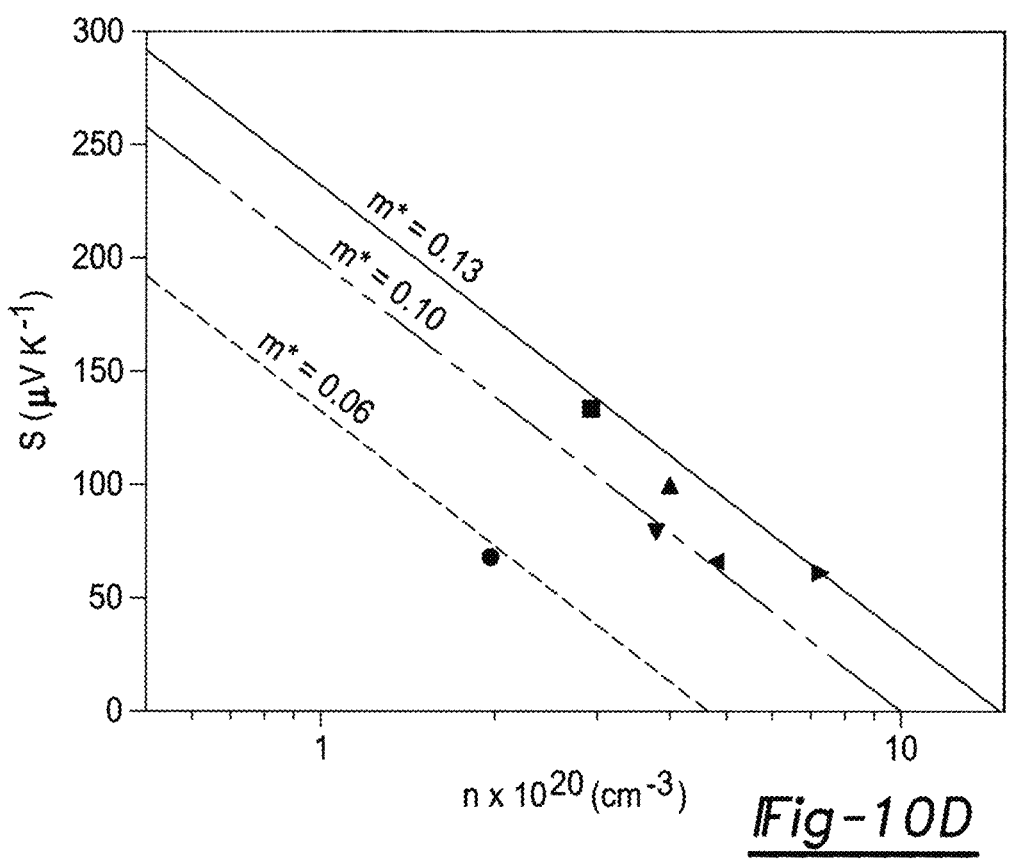

FIGS. 10A-10D show electronic transport in CS/CIS composites. FIG. 10A shows a temperature dependence of the carrier concentration of all samples extracted from Hall effect measurements. At 300K, the carrier concentration initially decreases upon incorporation of 1 mol. % CIS and then gradually increases with a further addition of CIS. Samples containing more than 1 mol. % CIS show an increase in the carrier concentration with rising temperature. Samples with large CIS content (30 mol. % and 50 mol. %) show the strongest temperature dependence of the carrier concentration. This unusual characteristic is possibly a result of carrier doping by the $CuInSe_2$ phase. FIG. 10B shows temperature dependent Hall mobility calculated using the measured electrical conductivity and carrier concentration. Note the large increase in the mobility for the sample containing 1 mol. % CIS compared to the pristine $Cu_2Se$ despite the small change in the carrier concentration. FIG. 10C shows a log-scale plot of the mobility as a function of temperature indicating that the temperature dependence of the mobility follows the general equation $\mu \propto T^{r-3/2}$, where T is the absolute temperature and r is the exponent reflecting the energy dependence of the carrier mean free path. From the experimental data, the mobility of pristine $Cu_2Se$ shows relatively weak energy dependence below the α-β transition temperature, which is proportional to $T^{-1}$. After the structural transition, a $T^{-3}$ dependence is observed, presumably due to the high interaction of mobile and disordered copper ions with the charge carriers. For the sample with 1 mol. % CIS, the mobility proportionality begins with $T^{-2}$ before the structural transition and on average maintains the $T^{-2}$ proportionality. FIG. 10D shows a Pisarenko plot showing the relationship between the Seebeck coefficient and the carrier concentration in various CS/CIS samples. The lower effective mass observed in the 1 mol. % CIS sample, compared to other compositions, explains its very high electrical conductivity. Calculations of the effective mass assume a single parabolic band model and scattering parameter A=1.5, corresponding to the ionized impurity electron scattering mechanism.

Figure 11:
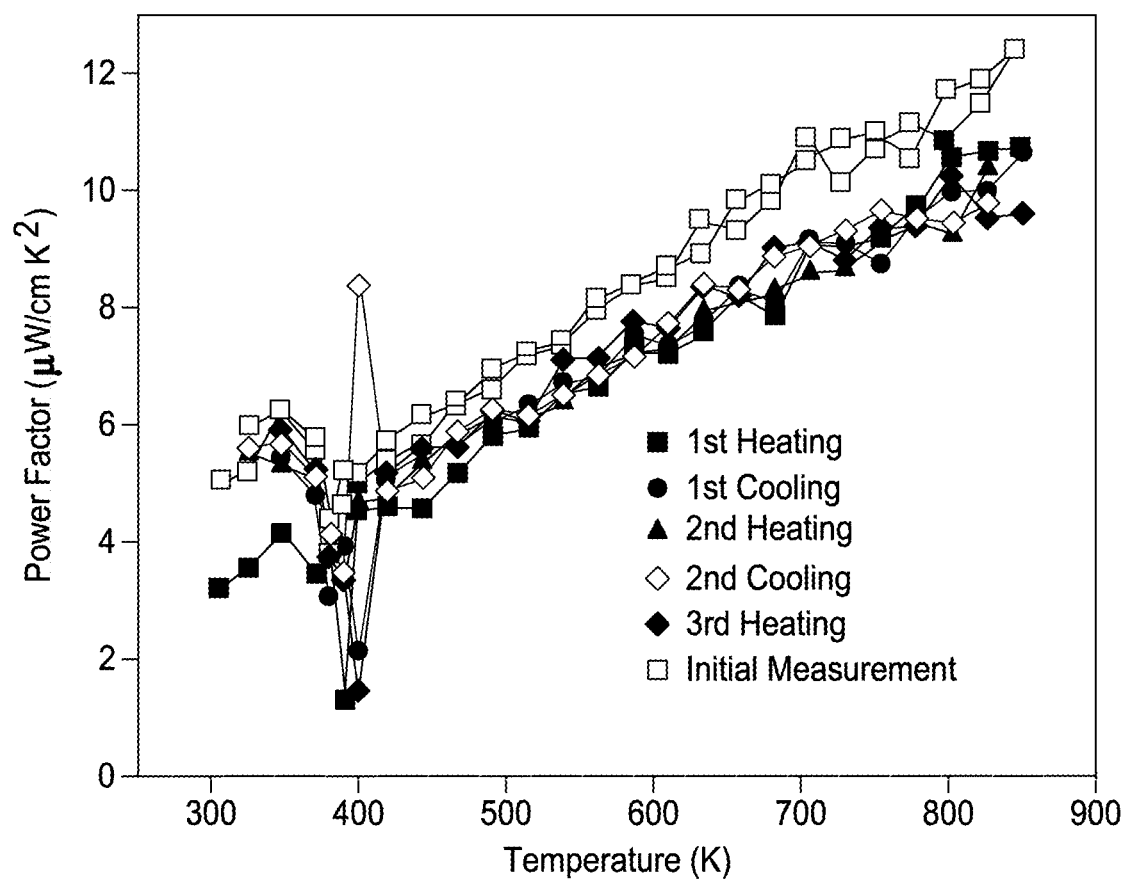

FIG. 11 shows power factor, $\sigma S^2$, stability testing for sample with 1 mol. % indium.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

As used herein, the terms "composition" and "material" are used interchangeably to refer broadly to a substance containing at least the preferred chemical constituents, elements, or compounds, but which may also comprise additional elements, compounds, or substances, including trace amounts of impurities, unless otherwise indicated.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will be described more fully with reference to the accompanying drawings.

Thermoelectric (TE) materials are functional materials that can directly covert heat into electricity or convert electricity into heat (or cooling). Thermoelectric power generation technologies can be used in a variety of applications, including thermoelectric hybrid generators, recovery of waste heat to convert it to electricity, for example, industrial waste heat, waste heat from vehicles, and the like, and photovoltaics, by way of non-limiting example. Thermoelectric materials are rare and only a few have found commonplace use within thermoelectric generators. Specifically, bismuth telluride ($Bi_2Te_3$), lead telluride (PbTe), and silicon germanium (SiGe) are commonly used thermoelectric materials. Each of these contain relatively large amounts of rare elements, which greatly increases the cost of the thermoelectric generators. Beyond cost, these materials require harsh mining practices that are environmentally damaging and some exhibit high levels of toxicity.

In order to address concerns with the use of rare and toxic metals in the development of thermoelectric generators, most research in this area has recently focused on developing new materials from earth-abundant elements like copper, tin, and selenium. Tin selenide (SnSe) and copper selenide ($Cu_2Se$) are thermoelectric materials that have Figure of Merit/ZT values of 2.6 at 923 K and 1.5 at 1000 K, respectively. Unfortunately, at these operating temperatures the materials display poor chemical and structural stability, which has generally precluded their use in mainstream thermoelectric generators. This instability is a believed to be a result of selenium evaporation from the material and physical features of the core crystal unit, which has a large number of vacancies allowing for extreme ionic mobility within the crystal. In accordance with certain aspects of the present disclosure, next-generation thermoelectric materials produced using earth-abundant metals are provided that have been engineered for enhanced stability and larger figures of merit that will promote the development and expanded use of advanced thermoelectric generators in various industries.

In certain variations, the present disclosure provides a method of manufacturing that enables concurrently, partial solubility of a specific, foreign metal within a crystal lattice of copper selenide ($Cu_2Se$) material and precipitation of coherent nanoscale inclusions throughout $Cu_2Se$ matrix, thus forming a nanocomposite. Such manufacturing techniques can provide a relatively low-cost and energy efficient method for large-scale synthesis of such stabilized $Cu_2Se$ nanocomposites. In one variation, a method of making a thermoelectric composition may comprise converting a precursor comprising copper diselenide ($CuSe_2$) into copper selenide ($Cu_2Se$) and copper metal selenide ($CuMSe_2$) by reacting the precursor with a reagent metal (M') and a distinct metal (M). M is selected from the group consisting of: indium (In), aluminum (Al), gallium (Ga), antimony (Sb), bismuth (Bi), and combinations thereof. The reagent metal (M') may be selected from the group consisting of: copper (Cu), silver (Ag), and combinations thereof. The reaction may proceed through controlled transformation of the template/precursor reagent, copper diselenide ($CuSe_2$), into copper selenide ($Cu_2Se$) and $CuMSe_2$, by reacting the precursor with appropriate predetermined amounts of elemental Cu and/or Ag. This reaction forms a nanocomposite comprising a matrix of the copper selenide ($Cu_2Se$) having a plurality of nanoinclusions comprising the copper metal selenide ($CuMSe_2$) distributed therein. In certain aspects, where Cu and Ag are employed as the reagent metal (M') and In as metal M, the Cu:Ag ratio can be tuned to create stable CuIn$_x$Se$_2$ containing nanometer scale inclusions with the CuM'Se$_2$ inclusions in the nanocomposite composition. For example, by tuning the M':M ratio, such as the Ag:M ratio, stable Cu$_{4-y}$Ag$_y$Se$_2$ nanometer scale inclusions can be formed along with the CuMSe$_2$ nanoinclusions in the nanocomposite composition. In certain aspects, the nanocomposite has an average figure of merit (ZT) of greater than or equal to about 1.5 at a temperature of less than or equal to about 850K (about 577° C.).

In certain variations, the converting is a sequential solid-state transformation of the precursor, where M is indium (In) and a (1−x)CuSe$_2$/(x)CuInSe$_2$ nanocomposite is made via a partial transformation of the CuSe$_2$ in the precursor via a first reaction (1) represented by: CuSe$_2$+(x) In→(1−x) CuSe$_2$+ (x) CuInSe$_2$ (1). The method may further include adding a reagent metal (M') comprising copper (Cu) to the products of the first reaction to transform remaining CuSe$_2$ into Cu$_2$Se via a second reaction (2) represented by: (1−x) CuSe$_2$+3(1−x) Cu+(x) CuInSe$_2$→(1−x) Cu$_4$Se$_2$+(x) CuInSe$_2$ (2). M is indium (In) that is added to the precursor comprising CuSe$_2$ at greater than or equal to about 0.5 mol. % to less than or equal 10 mol. %. Indium (In) is optionally added to the precursor comprising CuSe$_2$ at about 1 mol. %. In certain variations, the converting is a sequential solid-state transformation of the precursor, where M is indium (In) that is added to the precursor comprising CuSe$_2$ in a ball mill under an inert atmosphere to generate CuInSe$_2$, and elemental copper (Cu) is added to convert remaining CuSe$_2$ to copper selenide (Cu$_2$Se) to form a product comprising a mixed powder comprising copper selenide (Cu$_2$Se) and copper indium selenide (CuInSe$_2$). The mixed powder is removed from the ball mill and compressed into high density pellets, for example, having less than or equal to about 10% by volume open spaces or voids per total volume, optionally less than or equal to about 5% by volume voids per total volume, optionally less than or equal to about 3% by volume voids per total volume, and in certain variations, optionally less than or equal to about 2% by volume voids per total volume.

Accordingly, the present disclosure provides a thermoelectric composition or material that includes a novel nanocomposite material having a matrix comprising copper selenide (Cu$_2$Se) with nanometer scale inclusions or nanoinclusions, which help stabilize the thermoelectric composition permitting it to operate efficiently at significantly lower temperatures without structural or chemical degradation, as compared to Cu$_2$Se alone. Generally, a nanoscale inclusion is a discrete region or domain within the nanocomposite having a distinct composition from the remainder of the matrix that is "nano-sized" or "nanometer-sized" and has at least one spatial dimension that is less than about 1 μm (i.e., 1,000 nm), optionally less than about 0.5 μm (i.e., 500 nm), optionally less than about 0.4 μm (i.e., 400 nm), optionally less than about 0.3 μm (i.e., 300 nm), optionally less than about 0.2 μm (i.e., 200 nm), and in certain variations, optionally less than about 0.1 μm (i.e., 100 nm). Accordingly, each respective nanoinclusion may have at least one spatial dimension that is greater than or equal to about 1 nm and less than or equal to about 1,000 nm (1 μm). In certain variations, a nanoinclusion may have at least one spatial dimension of greater than or equal to about 1 nm to less than or equal to about 500 nm and in certain aspects, optionally greater than or equal to about 1 nm to less than or equal to about 250 nm. It should be noted that so long as at least one dimension of the nanoinclusion falls within the above-described nano-sized scale, one or more other dimensions may well exceed the nanometer size.

In various aspects, a thermoelectric composition is provided that comprises a nanocomposite comprising a copper selenide (Cu$_2$Se) matrix having a plurality of nanoinclusions comprising copper metal selenide (CuMSe$_2$) distributed therein. M is selected from the group consisting of: indium (In), aluminum (Al), gallium (Ga), antimony (Sb), bismuth (Bi), and combinations thereof. The present disclosure thus contemplates methods for chemical stabilization of Cu$_2$Se and an energy efficient process for the large-scale fabrication of stabilized-Cu$_2$Se bulk thermoelectric materials with large figures of merit (ZT). In one variation, the thermoelectric composition has an average figure of merit (ZT) of greater than or equal to about 1.5 at a temperature of less than or equal to about 850K (about 577° C.), for example, from greater than or equal to about 300K (about 77° C.) to less than or equal to about 850 K (about 577° C.).

As discussed further herein, the thermoelectric nanocomposites have good chemical stability and exhibit what is believed to be record high average Figure of Merit (ZT$_{ave}$) of approximately 1.5 over a broad temperature range (T≤850 K) in Cu$_2$Se/CuMSe$_2$ (M=Al, Ga, In, Sb, Bi) nanocomposites, with ZT values ranging from 0.6 at 450 K to an unprecedentedly large value of 2.6 at 850 K for an embodiment having 1 mol. % In. This performance is attributed to the localization of Cu$^+$ ions induced by the incorporation of In or other similar metals into the Cu$_2$Se lattice, which concurrently boosts the electrical conductivity and reduces the thermal conductivity of the nanocomposites. As such, the present disclosure contemplates large-scale utilization of stabilized Cu$_2$Se-based materials in thermoelectric generators.

In certain variations, the nanocomposite is represented by (1−x)Cu$_2$Se/(x)CuMSe$_2$, where x is greater than or equal to about 0.005 to less than or equal to about 0.1 and generally represents an amount of the metal M present in the composition. In certain variations, x is greater than or equal to about 0.005 and less than or equal to about 0.03. In one variation, x is about 0.01. The nanocomposite optionally comprises M at greater than or equal to about 0.5 mol. % to less than or equal to about 10 mol. % and in certain variations, M at greater than or equal to about 0.5 mol. % to less than or equal to about 3 mol. %. In one variation, M is present at about 1 mol. %.

In certain other variations, described further herein, M is indium. Indium is poorly soluble in copper selenide, which results in the presence of nanometer-scale inclusions of CuInSe$_2$ within the bulk copper selenide material. These inclusions reduce the mobility and long-range diffusion of copper, as well as reducing selenium evaporation. Such a material demonstrates improved electrical conductivity and reduced thermal conductivity, which improves the Figure of Merit for the material and makes it suitable for use as a thermoelectric material within thermoelectric generators. Decreases in the thermopower coefficient are more than offset by the improved electrical conductivity and diminished thermal conductivity. More specifically, the average Figure of Merit/ZT values for such a material are increased at lower temperatures by nearly twice what has been currently reported (e.g., for Cu$_2$Se alone), while simultaneously increasing the chemical stability at elevated temperatures.

Thus, in certain embodiments, a novel nanocomposite material with a matrix of Cu$_2$Se has a plurality of nanometer-scale inclusions of CuInSe$_2$, which stabilizes the material and allows it to operate efficiently at significantly lower temperatures without structural or chemical degradation, compared to $Cu_2Se$ alone. Where M is indium, the copper metal selenide comprises $CuInSe_2$, so that the nanocomposite is represented by $(1-x)Cu_2Se/(x)CuInSe_2$, where x is greater than or equal to about 0.005 to less than or equal to about 0.1 and generally represents an amount of indium present in the nanocomposite. In certain variations, x is greater than or equal to about 0.005 and less than or equal to about 0.03. In one variation, x is about 0.01. The nanocomposite optionally comprises indium at greater than or equal to about 0.5 mol. % to less than or equal to about 10 mol. % and in certain variations, indium at greater than or equal to about 0.5 mol. % to less than or equal to about 3 mol. %. In one variation, indium is present at about 1 mol. %. In certain aspects, the thermoelectric composition has a maximum figure of merit (ZT) of greater than or equal to about 2 at a temperature of less than or equal to about 850K (about 577° C.). This material utilizes earth-abundant and environmentally benign metals that is particularly suitable for use in thermoelectric generators to convert waste heat to electrical energy.

In certain variations, a nanocomposite thermoelectric material with 1 mol. % indium incorporation displays a maximum ZT value of 2.6 at 850 K, while the average ZT value is 1.5 over the temperature range of 300 K-850 K. For comparison, pure copper selenide requires temperatures of 1000 K to reach a maximum ZT value of 1.5. The broad operating temperature range indicates that the material will be capable of power generation even at room temperature. At lower temperatures, the material is less efficient with ZT values of 0.6 at 450 K. Such a material has an efficiency sufficient for use in larger scale energy production, provided it can be used on heat sources at 850 K.

The nanocomposite material may be produced using a $CuSe_2$ precursor and elemental indium and copper. Elemental indium, at 1 mol. % for example, is added to $CuSe_2$ in a ball mill under an inert atmosphere to generate small quantities of $CuInSe_2$. Elemental copper is then added to convert the remaining $CuSe_2$ to $Cu_2Se$. The mixed $Cu_2Se/CuInSe_2$ powder is then removed from the ball mill and compressed into high density pellets.

In certain other variations, the present disclosure contemplates thermoelectric devices having a thermoelectric component comprising a thermoelectric composition. The thermoelectric composition may comprise a thermoelectric nanocomposite composition having a copper selenide ($Cu_2Se$) matrix having a plurality of nanoinclusions comprising copper metal selenide ($CuMSe_2$) distributed therein, wherein M is selected from the group consisting of: indium (In), aluminum (Al), gallium (Ga), antimony (Sb), bismuth (Bi), and combinations thereof, as described above.

In certain aspects, the thermoelectric device may be a thermoelectric generator. Thermoelectric generators can be used in a variety of applications, including by way of non-limiting example, power sources for wearable or implantable electronics (watches, pacemakers, and the like) that have relatively low energy consumption and/or can use body heat to generate the required energy, automotive or vehicular power applications, where heat waste from the vehicle (e.g., engine block or exhaust system) is used to provide electrical energy for electronic components within the vehicle, nuclear power plants or industrial facilities, where excess waste heat can be converted to electrical energy to further improve the efficiency of power generation, manufacturing processes (e.g., steel making), military applications, for example, for power generation in submarines using waste heat from the engines or remote power generators, such as for battlefield power generation by combining the generator with a source of heat such as a small incinerator, radioisotope thermal generators (RTG) for deep-sea mining and to power devices, such as deep space probes, off-shore drilling or mining platforms. RTG units use a radioactive element as a heat source and an elemental source of cold temperature (e.g., space, seawater, and the like) to generate power. For deep-sea mining and deep-water drilling, cold water temperature is used to create the temperature difference across the thermoelectric device. Alternatively, thermoelectric generator that utilizes heat sources from solar panels/concentrators and cold water (e.g., from the deep sea) to create a temperature difference across the device can provide onsite power for offshore platforms or naval applications.

Thermoelectric generators are devices that utilize the Seebeck effect in order to generate electricity from heat. These devices are discussed in a hierarchical organization where a thermoelectric system is composed of multiple thermoelectric modules that comprise thermoelectric materials. An example of a simplified thermoelectric component or module 20 for use in a thermoelectric generator device is shown in FIG. 1. FIGS. 2A and 2B also illustrate migration of charge carriers in thermoelectric materials for a representative thermoelectric device. The basic unit of the generator system is the thermoelectric module 20, which contains two dissimilar thermoelectric materials, namely a first thermoelectric material 22 that may be a positively charged, p-type material and a second thermoelectric material 24 that may be a negatively charged, n-type material. The thermoelectric module 20 also includes a first side that has a first temperature and a second side that has a second temperature less than the first temperature. The first side may be a hot side region 26, for example, with a heat source and the second side may be a cold side region 28, with a heat sink.

A current flows in a circuit 30 between distinct electrodes 32 (e.g., a first electrode having a first polarity and a second electrode having a second polarity opposite to the first polarity) when there is a temperature differential from one side of the thermoelectric module 20 to the other (between hot side 26 and cold side 28), with current magnitude generally correlated with an amplitude of the temperature difference. Thus, the first thermoelectric material 22 and/or the second thermoelectric material 24 are in electrical communication with the first and second electrodes 32 and in thermal communication with the hot side region 26 and the cold side region 28. As discussed above, the thermoelectric effect refers to the direct conversion of a temperature difference to electric voltage within the thermoelectric module 20. The effect is the result of the temperature gradient causing charge carriers within the materials to diffuse from the hot side 26 to the cold side 28. Such a thermoelectric module 20 requires a strong temperature differential across the system, which generally requires some form of active cooling such as pumped water or heat exchangers (not shown). It should be noted that while not shown, the thermoelectric materials may also be used in a thermoelectric device that employs the Peltier effect for cooling, which may have a distinct design known to those of skill in the art.

FIGS. 2A-2B show a mechanism of migration of charge carriers in a thermoelectric device. In a thermoelectric device, n-type and p-type semiconductors can be assembled in series with respect to current flow, but in parallel with respect to heat flow, as shown in FIGS. 2A and 2B. FIG. 2A shows a schematic of migration of charge carriers, holes (antielectrons) and electrons, in a material with an applied thermal gradient representing the Seebeck effect for both n-type (electrons as the majority charge carriers) and p-type (holes as the majority charge carriers). FIG. 2B shows an illustration of a practical application of the Seebeck effect in a thermoelectric device including n-type and p-type legs.

In certain aspects, such thermoelectric devices can be integrated in any mechanical system that generates waste heat using mechanical contact or any other bounding approach. This will result in an increase in the temperature of the side of the thermoelectric (T) device, while the other side remains nearly at room temperature. This temperature difference leads to a differential potential (voltage) across the thermoelectric (TE) device creating a current flow in a closed circuit. The efficiency of this energy conversion process depends on the materials' Figure of Merit as well as the temperature difference maintained between the hot side and cold side of the device. Therefore, thermoelectric technology can find application a wide range of industries.

As background, conventional thermoelectric generators using conventional thermoelectric material have the following challenges. The typical efficiency of these generators is around 5-8%, which is low, but not prohibitively so as the thermal energy used to drive them would otherwise be wasted in most cases. In order to reach the necessary voltages to drive electrical devices, multiple modules must be connected in series, which results in increased resistances and lower delivered power. This can be avoided through electrical engineering methods in which the modules are instead connected in parallel and a regulator is used to boost the voltage delivered to the electronic device.

In some applications, it is important that heat be dissipated. The generators operate on the principle of temperature differential, and so typically used thermoelectric materials are poor thermal conductors. As a result, current generators are unsuitable for recovering heat from sources that require heat dissipation. Air is a poor coolant, so generators that rely on air to keep the cool side at a lower temperature will slowly heat over time and become significantly less efficient. This can be circumvented by using water cooling, but doing so requires that the generator also operate an electric pump, which reduces the total amount of power available for powering electronic devices.

By way of further background, high ZT values have been reported for chemically simple binary compounds such as SnSe (ZT~2.6 at 923 K) and $Cu_2Se$ (ZT~1.5 at 1000 K). The integration of $Cu_2Se$ and SnSe phases into $(Cu_2Se)_{1-x}$ $(SnSe)_x$ bulk composites led to ZT values as high as 1.4 at 825 K. Despite attractive attributes, such as large ZT, low cost, low toxicity and ease of synthesis that are associated with SnSe and $Cu_2Se$ materials, their deployment into working thermoelectric devices is still problematic due to structural and chemical instabilities at temperatures where high ZT values are achieved as well as the low average $ZT_{avg}$ approximately 1.1 within the measured temperature range. For instance, evaporation of Se atoms at high temperatures and Cu leakage under operating conditions are the most serious issues that preclude large-scale deployment of $Cu_2Se$ in working thermoelectric devices.

To understand the origin of such chemical instabilities, careful analysis of the atomic structure of $Cu_2Se$ reveals that the average occupation factor of various metals sites within the cubic crystal lattice is ⅔ implying the presence of intrinsic vacancies of 33%. This large degree of intrinsic vacancy is believed to be responsible for the superionic liquid-like behavior of $Cu^+$ ions in the $Cu_{2-x}Se$ structure. The disordered nature of copper within the crystal structure of $\beta$-$Cu_2Se$ leads to electrochemical instability due to high copper diffusion within the crystal lattice, leading to limitations in commercial applications.

More specifically, while not limiting the present disclosure to any particular theory, the origin of such chemical instabilities is believed to be as follows. $Cu_{2-x}Se$ crystallizes in the cubic structure (S.G. Fm-3m (#225)) known as the superionic high-temperature modification, $\beta$-$Cu_2Se$, at temperatures above 400 K and undergoes, upon cooling below 400 K, a reversible structural phase transition into a low-temperature modification known as $\alpha$-$Cu_2Se$ that crystallizes in the monoclinic space group, C2/c (#15). In the cubic structure, $Se^{2-}$ anions are closely packed into a face-centered cubic (fcc) framework with a statistical distribution of 4(2−x) $Cu^+$ cations in the four octahedral and eight tetrahedral interstitial sites. Therefore, the average site occupancy factor, f=4(2−x)/12, in $Cu_{2-x}Se$ structure depends on the degree of off-stoichiometry, x, with the maximum occupancy factor of ⅔ for the stoichiometric composition. This large degree of intrinsic vacancy is believed to be responsible for the p-type character as well as the superionic liquid-like behavior of $Cu^+$ ions in the $Cu_{2-x}Se$ structure. In this form, copper atoms are no longer localized at one position, but have kinetic freedom among their respective positions within the selenium framework. The disordered nature of copper within the crystal structure of $\beta$-$Cu_2Se$ leads to its characteristically low thermal conductivity and high thermoelectric efficiency. Unfortunately, the extreme ionic mobility of $\beta$-$Cu_2Se$ also favors electrochemical instability, leading to limitations in commercial applications.

To mitigate this problem, one can either stabilize Se evaporation and Cu leakage using high-performance diffusion barriers or reduce the module's average operating temperature. Unfortunately, the operating temperature for a high efficiency $Cu_2Se$ device must be well above the $\alpha$-$\beta$ phase transition (T>400K). Since this transition is unavoidable, a viable strategy to increase the feasibility of $Cu_2Se$-based thermoelectric modules, would be to raise the thermoelectric efficiency (large $ZT_{ave}$) within a temperature range well below 1000K, the benchmark temperature for $Cu_2Se$, and/or to reduce chemical instabilities due to high $Cu^+$ mobility.

Recently, there have been considerable efforts to improve the figure of merit of $Cu_2Se$-based materials at intermediate temperatures. For example, ZT values ranging from 1.4 to 1.85 at 900 K have been observed for $Cu_2Se$ nanomaterials produced via solution methods, and a ZT of 1.8 at 973 K was reported for $Cu_{2-x}Se$ single crystals prepared by the melting and quenching process.

In certain aspects, the present disclosure provides a solution to this problem via partial solubility of foreign metal atoms within the crystal lattice of $Cu_2Se$ and the formation of coherent nanometer scale inclusions within the $Cu_2Se$ matrix. By incorporating additional metal (M) within the intrinsic metal vacancies in the structure of $Cu_2Se$ in accordance with certain aspects of the present teachings, the mobility and long-range diffusion of Cu is minimized. Upon exceeding the solubility limit of M within the $Cu_2Se$ structure, it is believed that a supersaturation state is obtained leading to spontaneous phase segregation to form coherent $CuMSe_2$ nanoinclusions within the M-stabilized $Cu_2Se$ matrix. In this manner, an average ZT of $Cu_2Se$ at lower temperatures is increased by nearly twice what has been currently reported, while simultaneously increasing the chemical stability at elevated temperatures.

The methods of manufacturing of the present disclosure provide partial solubility of a foreign metal within the crystal lattice of copper selenide ($Cu_2Se$) and precipitation of coherent nanoscale inclusions throughout $Cu_2Se$ matrix. The reaction may proceed through controlled transformation of a template or precursor reagent, copper diselenide ($CuSe_2$) into copper selenide ($Cu_2Se$) and $CuMSe_2$, by reacting the template with appropriate amounts of metal (M) and a reagent metal (M') selected from elemental Cu and/or Ag. The resulting M-stabilized $Cu_2Se$ is a multiscale hierarchical composite in which $CuMSe_2$ and $Cu_2Se$ phases are integrated over multiple length scale from atomic to nanometer and micrometer scales. The embedded coherent $CuMSe_2$ nanoinclusions block long-range Cu diffusion and serve as additional phonon scattering centers as illustrated in FIG. 4E. In certain aspects, where both Cu and Ag are used as the metal reagent, a ratio of Cu:Ag can be tuned to create stable $CuM_xSe_2$ containing nanometer scale inclusions along with $CuM'_ySe_2$ nanometer scale inclusions in the $Cu_2Se$ matrix composition, where y is selected based on the charge of M', for example, y may be greater than 0 and less than 4. For example, when using Cu and Ag, upon tuning the Ag:M ratio, one can create stable $Cu_{4-y}Ag_ySe_2$ containing nanometer scale inclusions along with the $CuMSe_2$ nanoinclusions in the nanocomposite composition. Thus, the $Cu_2Se$ matrix may be stabilized by both $CuMSe_2$ and $CuM'_ySe_2$ nanoinclusions. Such techniques provide a relatively low-cost and energy efficient method for large-scale synthesis of such stabilized $Cu_2Se$ nanocomposites.

A schematic illustration of the solid-state transformation approach is shown in FIG. 3. By way of example, $CuInSe_2$ (CIS) is an excellent candidate structure for use as a phonon blocking nanoinclusion within a copper selenide ($Cu_{2-x}Se$ (CS)) matrix (also referred to herein as $Cu_2Se$, which may also be expressed as $Cu_4Se_2$) shown in FIG. 3. FIG. 3 illustrates the structural relationship between the idealized cubic structures of $\beta$-$Cu_2Se$ (labeled B) and $CuInSe_2$ (labeled C). Similar to the cubic structure of $Cu_2Se$ (a=5.840(1) Å; Fm-3m), the $Se^{2-}$ anions in the cubic phase (zinc blende) of $CuInSe_2$ (a=5.853(1)Å; F-43m) are also closely packed into a face-centered cubic (fcc) framework. The small lattice mismatch, $\Delta a/a$=0.2%, is favorable for endotaxial insertion of CIS nanocrystals into the CS matrix, as well as the formation of highly coherent phase boundaries at the CS/CIS interfaces. While $CuInSe_2$ relaxes below 1073 K to a tetragonal chalcopyrite structure (a=5.780(1) Å, c=11.64(2) Å; space group I-42d) the similarity in the lattice parameters within the ab plane still ensures semi-coherency at the CS/CIS interfaces (labeled D). The main structural difference between both phases lies in the distribution of cations and the vacancies within the available octahedral and tetrahedral interstices of the $Se^{2-}$ fcc lattice. Unlike the superionic $Cu_2Se$ structure (FIG. 3, labeled B) where the $Cu^+$ cations are statistically distributed over all twelve interstitial sites with a maximum site occupancy of ⅔, the $Cu^+$ and $In^{3+}$ cations are distributed statistically in half of the tetrahedral interstitial sites in the $CuInSe_2$ structure with the maximum site occupancy of 100% (FIG. 3, labeled C). This difference in the distribution of metal atoms ensures minimal solubility between $Cu_2Se$ and $CuInSe_2$ phases. Therefore, in (1−x)$Cu_2Se$/(x)$CuInSe_2$ composites, the coexistence of CIS nanoinclusions and a $Cu_2Se$ matrix with atomic-scale semi-coherency at their interfaces can be expected (FIG. 4E). This analysis is consistent with the investigation of $Cu_2Se/In_2Se_3$ interfaces, which show the formation of stable CS/CIS interfaces away from the $Cu_2Se/In_2Se_3$ reaction front.

In certain variations, the present disclosure contemplates an elegant two-step reaction pathway to fabricate (1−x)$Cu_2Se$/(x)$CuInSe_2$ nanocomposites in which the CIS inclusions and the CS matrix are crystallographically registered at their interfaces, in which a template precursor, $CuSe_2$ (FIG. 3, labeled A), is gradually converted into both CS (FIG. 3, labeled B) and CIS (FIG. 3, labeled C) phases through a two-step solid-state transformation process. Due to the high tolerance of off-stoichiometry for both CS and CIS phases, this method avoids the possible co-nucleation of non-stoichiometric CS and CIS nanoparticles, leading to enhanced chemical control of both phases. Careful examination of the XRD patterns of various (1−x)$Cu_2Se$/(x)$CuInSe_2$ nanocomposites after each step of the transformation process reveals the formation of a predominantly $Cu_2Se$ phase for compositions with x≤0.1 with no discernible peaks associated with $CuInSe_2$. The absence of CIS diffraction peaks can be associated with the small fraction of CIS in the composite and/or the solubility of indium within CS at very low concentrations. However, the difficulty in observing these CIS compositions may arise from the structural similarity of CS and CIS compounds (FIG. 4E) that leads to a severe overlap of the major peaks. This analysis is in line with previous study of the crystallographic relationship between CS and CIS, which revealed a parallel alignment of atomic planes at the CS/CIS interfaces where both phases adopt a pseudocubic structure. See T. Wada, et al. *J Mater Res*, 12, 1456-1462 (1997), the relevant portions of which are incorporated herein by reference. This parallel alignment of crystal planes at CS/CIS interfaces is further confirmed by the XRD pattern of a composite containing 50 mol. % $CuInSe_2$ (x=0.5), which predominantly shows diffraction peaks that can be associated with the $CuInSe_2$ phase. To probe the coexistence of $Cu_2Se$ and $CuInSe_2$ phases in the synthesized composites, specimens of the 99% CS/1% CIS and 50% CS/50% CIS samples are examined using scanning transmission electron microscopy (STEM).

As shown in FIGS. 4A-4C, the 50% CS/50% CIS samples exhibit a hierarchical microstructure in which both phases are integrated at multiple length scale from atomic scale to micrometer scale. For instance, FIG. 4A shows an interwoven network of microscale CS and CIS phases in the 50% CIS composite, where closer inspection reveals a range of CIS nanocrystals randomly dispersed within a CS matrix (FIGS. 4B-4C). The formation of both a high density of randomly dispersed nanoparticles of CIS within the CS matrix and micrometer scale CIS grains suggests that the transformation takes place through a local solid-state reaction between elemental In and the $CuSe_2$ precursor. Furthermore, upon powder densification these nanoscale CIS particles agglomerate to form the observed microscale CIS islands. Interestingly, STEM images of the sample containing 1 mol. % In show a homogenous well-ordered atomic structure (FIG. 4D). The lack of a second phase confirms the solubility of In within the $Cu_2Se$ lattice in the 99% CS/1% CIS sample (See FIG. 9A). The coexistence of CS and CIS phases in various composites is additionally verified by differential scanning calorimetry (DSC) (FIG. 9B), scanning electron microscopy (SEM), and X-ray photoelectron spectroscopy (XPS). As illustrated in FIG. 4E, the observed hierarchical structure of (1−x)$Cu_2Se$/(x)$CuInSe_2$ composites can enhance the chemical stability of the CS phase by limiting Cu ions diffusion. In addition, these coherent CIS nanoparticles may act as acoustic phonon scattering centers leading to a drastic reduction in thermal conductivity.

Thermoelectric properties: the introduction of various fractions of indium in the CS matrix drastically alters the electronic and thermal behavior of the resulting compounds when compared to the pristine $Cu_2Se$ sample synthesized and processed under similar conditions. At 325 K, the electrical conductivity of the pristine $Cu_2Se$ sample is approximately 372 S $cm^{-1}$ and rapidly increases to approximately 940 S $cm^{-1}$ for the 99.5 mol % CS/0.5 mol % CIS sample (FIGS. 8A, 8C). Upon increasing the fraction of the CIS content to 1 mol. %, the electrical conductivity of the sample at 325K further increases to approximately 1300 S cm$^{-1}$. The observed increase in the electrical conductivity is accompanied by a large drop of the thermopower at 325 K from approximately 133 µVK$^{-1}$ for the pristine sample to 86 µVK$^{-1}$ for the sample with 0.5 mol. % CIS and to 61 µVK$^{-1}$ for the sample containing 1 mol. % CIS (FIGS. 8B, 8D). The observed change in electronic properties can be theorized by considering In incorporation into the Cu$_2$Se lattice. Indeed, a low solubility of indium (less than 2 at. %) in CS was reported in a previous study (J. S. Park et al., *Journal of Applied Physics*, 2000, 87, 3683-3690, the relevant portions of which are incorporated herein by reference) of the Cu$_2$Se/In$_2$Se$_3$ interfaces. The incorporated In atoms within the Cu$_2$Se lattice presumably reside within various Cu sites owing to their low occupancy factor (66%). Without limiting the present disclosure to any particular theory, it is believed that the incorporated In atoms will induce shallow impurity states near to the conduction band of CS lattice leading to n-type doping. While this analysis is consistent with the observed marginal reduction in the carrier density compared to that of the pristine Cu$_2$Se matrix (FIG. 8D), it cannot explain the large drop in the thermopower and the large increase in the carrier mobility and electrical conductivity (FIG. 8C), assuming a constant carrier effective mass.

A decrease in the carrier concentration would correlate with an increased Seebeck and decreased electrical conductivity, which is opposite to the trend observed for samples with x=0.005 and x=0.01 (FIGS. 8A, 8B). Therefore, this unusual trend suggests that indium plays a more complicated role than simple doping upon incorporation into the CS matrix. Again without limiting the present teachings to any particular theory, one plausible explanation for the observed trend in the electronic properties of samples with x≤0.01 is that the intermixing of indium at the various Cu sites within the Cu$_2$Se lattice results in the formation of a hybrid "Cu$_2$Se-like" local substructure reminiscent of the distribution of Cu/In in the CIS structure (FIG. 3, labeled C). In such a hybrid "Cu$_2$Se-like" structure, a large reduction in the diffusivity of Cu$^+$ ions within the Cu$_2$Se lattice can be anticipated (lowering the total entropy of the system as observed from heat capacity measurement (FIG. 5B)) and, hence, a large increase in the carrier mobility due to weakened scattering of charge carriers by diffuse Cu$^+$ ions. This analysis is consistent with the observed large increase in the electrical conductivity (FIG. 8A) and carrier mobility (FIG. 10B) of (1−x)CS/(x)CIS composites compared to the pristine Cu$_2$Se matrix. Additionally, the overall increased rigidity of the CS matrix caused by the Cu/In substructures presumably lead to sudden decrease in the effective mass (FIG. 10D) resulting in the observed large drop in the thermopower (FIG. 8B).

For (1−x)CS/(x)CIS composites with x≥0.03, the concentration of In atoms is above the solubility limit (<2 at. %). Therefore, a supersaturation of In atoms within the hybrid "Cu$_2$Se-like" intermediate structure induces the precipitation of CIS nanoinclusions within the Cu$_2$Se matrix. The formation of semicoherent CS/CIS interfaces within various (1−x)CS/(x)CIS composites with x≥0.03 partially accounts for their lower electrical conductivity when compared to the sample with x=0.01. However, the reduction in the electrical conductivity of (1−x)CS/(x)CIS composites with x≥0.03 can also be explained by partial doping of the Cu$_2$Se matrix by low mobility carriers from the CIS nanoinclusions (FIGS. 8A, 10B). The above analysis is consistent with the observed decrease in the thermopower and increase in the carrier concentration of (1−x)CS/(x)CIS composites with x≥0.03 (FIGS. 8B, 10A). It is interesting to note that at low temperatures the electrical conductivity is somewhat similar for samples with x=0.03 and x=0.10, but diverges after the α-β phase transition of CS. The observed trend in the electrical conductivity at higher temperatures is consistent with increasing solubility of indium in the Cu$_2$Se lattice as seen on a Cu$_2$Se—CuInSe$_2$ pseudo-binary phase diagram (FIG. 9A). The dissolution of a fraction of the preexisting CIS nanoparticles for the x=0.10 composition reduces the density of CS/CIS semicoherent boundaries causing a marginal increase in the electrical conductivity. A similar trend can be seen for the sample with x=0.30, where the further dissolution of CIS nanoparticles is anticipated to have a stronger effect than x=0.10. However, in the sample with x=0.50, this effect is overshadowed by the contribution of the n-type CIS phase to the electronic transport. At high indium concentrations the CIS nanoparticles begin to cluster, forming a network of CIS phases as observed from backscattered electron micrographs and EDS mapping.

FIG. 5B shows the total thermal conductivity of (1−x)CS/(x)CIS composites. At 325K, the thermal conductivity of the pristine Cu$_2$Se sample is 0.9 W m$^{-1}$ K$^{-1}$, which is lower than the previously reported values (~1-1.5 Wm$^{-1}$ K$^{-1}$ at 300K). The large decrease in the thermal conductivity of Cu$_2$Se can be attributed to a large reduction in the grain size and the incorporation of a small fraction of SiO$_x$ particles resulting from extensive mechanical milling. Introducing a small fraction of indium (x=0.005) within the Cu$_2$Se matrix slightly increases the total thermal conductivity, which is consistent with the observed increase in the electrical conductivity as well as an increase in the measured heat capacity, C$_p$, of the sample (FIG. 5B). Surprisingly, further increasing the CIS content to x=0.01 and 0.03 results in a drop of the total thermal conductivity to approximately 0.5 Wm$^{-1}$ K$^{-1}$ at 325 K, despite the large increase in their electrical conductivity (FIG. 8A). The observed large decrease in the thermal conductivity of samples with x=0.01 and x=0.03 is consistent with the large drop in their measured C$_p$ (FIG. 5B). In general an increase or decrease in the heat capacity of a material corresponds to an increase or decrease in the degrees of freedom of atomic motions within its structure. This implies that for the Cu$_2$Se structure atomic motions, such as atomic vibration and the diffusivity of Cu$^+$ ions within the crystal lattice, decrease upon incorporation of 1% to 3% In. This result further supports the hypothesis that the large reduction in the thermopower and large increase in the electrical conductivity and carrier mobility in samples with x≤0.1 arise from the decrease in copper disorder (decreased copper diffusion) within the Cu$_2$Se lattice.

Assuming a Lorenz number of 2.44×10$^{-8}$ WΩK$^{-2}$, the observed ultralow total thermal conductivity for the samples with x=0.01 and 0.03 implies a negative lattice contribution to the thermal conductivity ($\kappa_L$). For $\kappa_L$ to be positive, L would have to be less than approximately 1.3×10$^{-8}$ WΩK$^{-2}$ for sample with x=0.01 and less than approximately 1.6×10$^{-8}$ WΩK$^{-2}$ for the sample with x=0.03. At these concentrations, the fraction of In atoms dissolved into the Cu$_2$Se crystal lattice has not yet reached saturation so as to nucleate CuInSe$_2$ nanoparticles (FIG. 9A). Hence, the unique coexistence of Cu—Se and (Cu/In)—Se types of bonding within the Cu$_2$Se lattice may be responsible for the exceptional softening of lattice vibrations resulting in the observed ultra-low total thermal conductivity for the samples with x=0.01 and x=0.03. This vibrational softening may also explain why the measured specific heat capacity for x=0.01 and x=0.03 decreases much lower than the pristine $Cu_2Se$ at various temperatures (FIG. 5B). Further increasing the fraction of CIS to x≥0.01 results in a gradual increase in the total thermal conductivity from ~0.9 $Wm^{-1}$ $K^{-1}$ for x=0.05 to 1.5 $Wm^{-1}$ $K^{-1}$ for x=0.5 at 325 K. This suggests a partial contribution of the large thermal conductivity of CIS (approximately 4.6 $Wm^{-1}$ $K^{-1}$ at 325K)[31] inclusions to the total thermal conductivity of the synthesized composites. As the temperature increases, the thermal conductivity of the (1−x)CS/(x)CIS composites with x≤0.1 remains nearly constant, whereas the samples with a higher CIS content show a gradual drop in the total thermal conductivity with increasing temperature.

Overall, the observed enhancements in the electrical conductivity with a moderate drop in the thermopower of (1−x)CS/(x)CIS composites, when compared to the pristine $Cu_2Se$ matrix, results in large improvements of the power factor (PF) from 300 to 875 K (FIG. 6A). The PF of all samples with x≤0.1 rapidly increases with temperature, outperforming the pristine $Cu_2Se$ matrix at 550 K. At 875 K, PF values as high as 9 $\mu Wcm^{-1}$ $K^{-2}$ are obtained for the samples with x=0.005 and 0.03, whereas the x=0.01 sample showed the highest PF of ~12 $\mu Wcm^{-1}$ $K^{-2}$ (FIG. 6A). The large increase in the PF of various (1−x)CS/(x)CIS composites, while maintaining the low total thermal conductivity of $Cu_2Se$, results in large improvements of the figure of merits at all temperatures. Above 400 K, all (1−x)CS/(x)CIS composites with x≤0.1 outperformed $Cu_2Se$ (FIG. 6B). Interestingly, the sample with x=0.03 shows a ZT value as high as 0.6 at 325 K, which is twice the value previously reported for the $Cu_{2-x}Se$ sample at the same temperature. Following the α-β phase transition, the ZT value of this sample (x=0.03) rapidly increases with rising temperature and reaches approximately 2.1 at 850 K (FIG. 6B). An even larger enhancement in ZT is observed for the sample containing 1 mol. % CIS with the ZT value exceeding 2.5 at 850 K and a record high average $ZT_{ave}$ approximately 1.45 within the temperature range from 300 to 850 K. Given the temperature dependence of this material (x=0.01), ZT values exceeding 3.0 can be expected above 1000 K.

FIG. 11 shows power factor, $\sigma S^2$ (or $\mu Wcm^{-1}$ $K^{-2}$) stability testing for sample with 1 mol. % indium. The repeatability of power factor demonstrates the stability of $Cu_2Se$-1 mol. % In over four heating and cooling cycles.

FIG. 7 shows a comparison of maximum ZT achieved by a variety of Heusler compounds, Cu-based chalcogenides, (Sn,Pb)(Se,Te) compounds, Skutterudites, and indium stabilized $Cu_2Se$ compositions represented by two data points representing embodiments of the present invention ($Cu_2Se$-1 mol. % In and $Cu_2Se$-3 mol. % In). With respect to the copper-based compounds, such as $Cu_2(Se,S)$ and $CuSFeS_4$, the indium optimized $Cu_2Se$ materials demonstrate a significantly higher maximum ZT for any give temperature. The observed high ZT values for both the 1 mol. % and 3 mol. % indium compositions at lower temperatures is of significant importance since this enables the possibility of moderate temperature thermoelectric modules. When compared to other classes of compounds, Cu-based chalcogenides known to date fall short of some Skutterudite and (Sn,Pb)(Se,Te) compounds within the temperature range 800-900 K. However, the indium optimized $Cu_2Se$ materials prepared in accordance with certain aspects of the present disclosure bridge the gap between high performance Skutterudite and (Sn,Pb)(Se,Te) compounds. In fact, the $Cu_2Se$-1 mol. % In and $Cu_2Se$-3 mol. % In compositions show better performance than the best Skutterudite compounds and are as high as the leading materials in (Sn,Pb)(Se,Te)-based compounds, but at lower temperatures.

Chemical Stability: as discussed above, the formation of hierarchical composites between CS and CIS phases with their structural integration from atomic to micrometer scales is expected to limit the diffusivity of $Cu^+$ ions within the samples due to the lack of Cu diffusion in CIS and the stabilization of Cu upon dissolution of indium within the $Cu_2Se$ crystal lattice. This hypothesis is partially supported by the significant decrease in the $C_p$ of samples with x=0.01 and x=0.03. To demonstrate the stability of $Cu^+$ ions for the synthesized CS/CIS composites, an electromigration test is conducted, where selected samples (x=0 and x=0.01) undergo accelerated current stress conditions. Table 1 shows a summary of experimental parameters and observations for materials known to have chemical migration of copper under an applied current.

TABLE 1

Summary of electromigration tests of $Cu_2Se$ and $Cu_2Se$ − 1 mol. % indium with comparison to relatively high figure of merit materials.

| Material | Tested conditions | Observations | Reference |
|---|---|---|---|
| $Cu_2Se$ | 100 $A/cm^2$ (70 A/cm) for 24 hours | Multiple large formations of copper wires on negative electrode | Comparative Example |
| $Cu_2Se$ − 1 mol. % In | 100 $A/cm^2$ (70 A/cm) for 24 hours | No visible degradation, No copper extrusion observed | Inventive Example |
| $Cu_2Se$ | ~9.6 $A/cm^2$ (9 A/cm) for 24 hours | Copper wire bundles observed on negative electrode | Brown et al., Journal of Electronic Materials, 2013, 42, 2014-2019. |
| $Cu_2S$ | 12 $A/cm^2$ for 12 hours | Copper whiskers and cracks observed on negative electrode | Dennler et al., Advanced Energy Materials, 2014, 4, 1301581. |
| $Cu_4FeS_4$ | 12 $A/cm^2$ (4.8 A/cm) for ~17 hours | Electrical resistivity to 90% of original measurement | Qiu et al., Energy & Environmental Science, 2014, 7, 4000-4006. |

When comparing these different stability tests it is important to consider the applied current density, I*L/A or I/A, where I is current, L is bar length, and A is cross-sectional area. For $Cu_2Se$-based materials, the test results are compared to the work by Brown et al., Journal of Electronic Materials, 2013, 42, 2014-2019, the relevant portions of which are incorporated by reference, where a current density of approximately 9.6 $A/cm^2$ is applied for 24 hours. This results in copper extrusion in the form of bundled wires at the negative electrode, which are identified via scanning electron microscopy. In the prepared examples, a current density of 100 $A/cm^2$ is applied for 24 hours for both $Cu_2Se$ and $Cu_2Se$-1 mol. % indium. In the case of $Cu_2Se$, which serves as a reference, a similar extrusion of copper is observed, but in the form of much larger bundles of copper wires at the negative terminal due to the large applied current density. However, the stability test for $Cu_2Se$-1 mol. % In shows no visible sign of degradation of the sample or Cu extrusion at an applied current density of 100 $A/cm^2$ for 24 hours. This suggests that indium suppresses long-range copper ion migration by reducing the total length of copper migration pathways. A similar effect has been observed in $CuFeS_4$, where Fe acts as the Cu-ion mobility disruption center in the high temperature structure of $CuSFeS_4$. In comparison to CusFeS$_4$, the indium modified Cu$_2$Se results in a much larger ZT value, while providing chemical stability superior to CusFeS$_4$. These results can enable large-scale implementation of Cu$_2$Se-based materials in thermoelectric energy conversion devices.

Examples (1−x)Cu$_2$Se/(x)CuInSe$_2$ nanocomposites are synthesized in a two-step reaction process involving a sequential solid-state transformation of a pre-synthesized CuSe$_2$ precursor using incremental amounts of elemental In and Cu. In the first step, (1−x)CuSe$_2$/(x)CuInSe$_2$ composites are fabricated through a partial transformation of the CuSe$_2$ precursor using various amounts of In, according to the chemical equation:

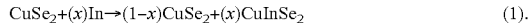

$$\text{CuSe}_2 + (x)\text{In} \rightarrow (1-x)\text{CuSe}_2 + (x)\text{CuInSe}_2 \qquad (1).$$

The resulting product is subsequently reacted with an equivalent amount of Cu to complete the transformation of the remaining CuSe$_2$ into Cu$_2$Se following the chemical equation:

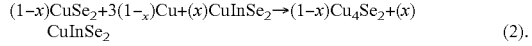

$$(1-x)\text{CuSe}_2 + 3(1-x)\text{Cu} + (x)\text{CuInSe}_2 \rightarrow (1-x)\text{Cu}_4\text{Se}_2 + (x)\text{CuInSe}_2 \qquad (2).$$

For each reaction step, the starting mixtures are loaded under an inert atmosphere into agate jars along with agate balls and mechanically alloyed using planetary ball milling. The ratio of agate balls to reactants is 5:1 by weight. The resulting fine grain polycrystalline powders of (1−x)CuSe$_2$/(x)CuInSe$_2$ composites are consolidated into high density pellets using a uniaxial hot-press. The thermopower and the electrical resistivity are measured simultaneously using an ULVAC-RIKO ZEM-3 apparatus. The instrument's precision on the electrical resistivity and the Seebeck coefficient data is ±4%. Thermal diffusivity (D) data are measured using the laser flash method with a Linseis LFA 1000 instrument. Heat capacity (C$_p$) values are calculated from measured differential scanning calorimetry data using the ratio method and a certified sapphire reference. The accuracy of the data collected is determined to be within 2%, with the machine precision of ±4%. The thermal conductivity is calculated according to the equation $\kappa = D \times C_p \times d$ where d is the density of the sample. Hall effect measurements are performed using an AC 4-probe method in a custom built apparatus under a maximum field of 1 Tesla. The carrier concentration (n) and the mobility (μ) are extracted using the Hall effect (R$_H$=1/n×e) and the electrical conductivity data. The microstructure and chemical composition of hot pressed samples was characterized using scanning electron microscopy and energy dispersive spectroscopy using a JEOL-7800FLV FE SEM equipped with an Oxford EDAX system. The internal structure is examined using STEM on a JEOL 2100f.

The synthesis of indium modified Cu$_2$Se compounds strategically follows a size hierarchy method for sustaining low thermal conductivity and chemical stability by introducing phonon/Cu-ion impeding objects on the atomic scale, nanoscale, and microscale. At the atomic scale, all Cu$_2$Se/In materials show a degree of indium solubility, up to 2 at. %, where indium atoms occupy copper sites within the Cu$_2$Se lattice. The difference in atomic mass and size helps disrupt phonon propagation, while also limiting degrees of freedom for copper mobility. The first step of ball milling introduces CuInSe$_2$ nanoparticles, where the density of particles depends on the initial concentration of indium added. At sufficient concentration, these nanoparticles can disrupt phonon propagation, which further compounds on the effect resulting from indium solubility. The second ball milling step serves two purposes, where one is to convert the unreacted CuSe$_2$ into Cu$_2$Se and the second being sub-micron grain reduction. This final step allows for an even greater accumulation of phonon impeding sources. Together these multiscale phonon and copper ion impeders provide a methodological hierarchy to enhance material performance.

The present disclosure provides in certain variations, new methods to producing chemical and thermally stable low-cost bulk thermoelectric materials with enhanced figure of merit, $ZT = S^2 \sigma T/\kappa_{total}$ (S is Seebeck coefficient, σ is electrical conductivity, T is absolute temperature, and $\kappa_{total}$ is total thermal conductivity). In particular, the present disclosure relates to use of Earth abundant and sustainable thermoelectric materials based on copper and selenium containing nanometer scale inclusions, in which long-range atomic diffusion is constrained by partial dissolution of foreign metals within the crystal lattice to achieve chemical stability and the formation. The resulting stabilized and nanostructured materials display large thermoelectric figure of merit, which make them attractive for incorporation into next-generation high efficiency thermoelectric generators for commercial and military applications, by way of non-limiting example.

Certain aspects of the present disclosure provide ZT values as high as 2.6 that can be achieved at moderate temperatures (≤850K) in the Cu$_2$Se matrix upon partial dissolution of Iridium and atomic-scale incorporation of CuInSe$_2$ inclusions. It is believed that the limited solubility between CS and CIS enables the incorporation of a small fraction of In into the Cu$_2$Se lattice inducing partial localization of Cu$^+$ ions and the formation of a hybrid structure in which CIS-type and CS-type units are trapped within the same Se$^{2-}$ fcc lattice. This leads to a simultaneous increase in the carrier mobility and a drastic reduction in the lattice thermal conductivity, resulting in large improvements in the ZT values of various (1−x)CS/(x)CIS composites in the whole temperature range (ZT$_{ave}$ of approximately 1.5). Furthermore, the partial solubility of indium in Cu$_2$Se is believed to be responsible for the electromigration stability of Cu$^+$ ions in the crystal lattice. The ability to achieve large ZT values at moderate temperatures, where Se evaporation is minimized, simultaneously with copper electrochemical stability in (1−x)CS/(x)CIS composites enables their widespread deployments into thermoelectric energy conversion devices.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermoelectric composition comprising:
   a nanocomposite comprising a copper selenide (Cu$_2$Se) matrix having a plurality of nanoinclusions comprising copper metal selenide (CuMSe$_2$) distributed therein, wherein M is selected from the group consisting of: indium (In), aluminum (Al), gallium (Ga), antimony (Sb), bismuth (Bi), and combinations thereof and the thermoelectric composition has an average figure of merit (ZT) of greater than or equal to about 1.5 at a temperature of less than or equal to about 850K (about 577° C.).

2. The thermoelectric composition of claim 1, wherein M is indium and the copper metal selenide comprises $CuInSe_2$, so that the nanocomposite is represented by $(1-x)Cu_2Se/(x)CuInSe_2$, wherein x is greater than or equal to about 0.005 to less than or equal to about 0.1.

3. The thermoelectric composition of claim 2, wherein the thermoelectric composition has a maximum figure of merit (ZT) of greater than or equal to about 2 at a temperature of less than or equal to about 850K (about 577° C.).

4. The thermoelectric composition of claim 2, wherein x is greater than or equal to about 0.005 and less than or equal to about 0.03.

5. The thermoelectric composition of claim 2, wherein x is about 0.01.

6. The thermoelectric composition of claim 1, wherein the nanocomposite comprises M at greater than or equal to about 0.5 mol. % to less than or equal to about 10 mol. %.

7. The thermoelectric composition of claim 1, wherein the nanocomposite comprises M at greater than or equal to about 0.5 mol. % to less than or equal to about 3 mol. %.

8. The thermoelectric composition of claim 1, wherein the plurality of nanoinclusions further comprises $Cu_{4-y}Ag_ySe_2$, where y is greater than 0 and less than 4.

9. A thermoelectric device comprising:
a first electrode;
a second electrode having an opposite polarity to the first electrode;
a first side having a first temperature;
a second side having a second temperature that is less than the first temperature; and
a thermoelectric component is electrical communication with the first electrode and the second electrode and in thermal communication with the first side and the second side, the thermoelectric component comprising a thermoelectric nanocomposite composition comprising a copper selenide ($Cu_2Se$) matrix having a plurality of nanoinclusions comprising copper metal selenide ($CuMSe_2$) distributed therein, wherein M is selected from the group consisting of: indium (In), aluminum (Al), gallium (Ga), antimony (Sb), bismuth (Bi), and combinations thereof and the thermoelectric nanocomposite composition has an average figure of merit (ZT) of greater than or equal to about 1.5 at a temperature of less than or equal to about 850K (about 577° C.).

10. The thermoelectric device of claim 9, wherein the thermoelectric device is used as a power source for a device selected from the group consisting of: a wearable electronic device, an implantable electronic device, a vehicle, an industrial facility, a nuclear power plant, a manufacturing facility, a submarine, a remote power generator, a radioisotope thermal generators (RTG), and combinations thereof.

11. A method of making a thermoelectric composition comprising:
converting a precursor comprising copper diselenide ($CuSe_2$) into copper selenide ($Cu_2Se$) and copper metal selenide ($CuMSe_2$) by reacting the precursor with a reagent metal (M') selected from the group consisting of: copper (Cu), silver (Ag), and combinations thereof and a metal (M) selected from the group consisting of: indium (In), aluminum (Al), gallium (Ga), antimony (Sb), bismuth (Bi), and combinations thereof to form a nanocomposite comprising a matrix of the copper selenide ($Cu_2Se$) having a plurality of nanoinclusions comprising the copper metal selenide ($CuMSe_2$) distributed therein, wherein the nanocomposite has an average figure of merit (ZT) of greater than or equal to about 1.5 at a temperature of less than or equal to about 850K (about 577° C.).

12. The method of claim 11, wherein the reagent metal (M') comprises copper (Cu) and silver (Ag).

13. The method of claim 11, wherein the converting is a sequential solid-state transformation of the precursor, wherein the reagent metal (M') comprises copper (Cu) and M comprises indium (In) and a $(1-x)CuSe_2/(x)CuInSe_2$ nanocomposite is made via a partial transformation of the $CuSe_2$ in the precursor via a first reaction represented by:

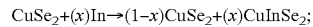

$CuSe_2+(x)In \rightarrow (1-x)CuSe_2+(x)CuInSe_2$;

adding the reagent metal (M') comprising copper (Cu) to the products of the first reaction to transform remaining copper diselenide ($CuSe_2$) into copper selenide ($Cu_2Se$) via a second reaction represented by:

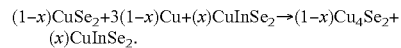

$(1-x)CuSe_2+3(1-x)Cu+(x)CuInSe_2 \rightarrow (1-x)Cu_4Se_2+(x)CuInSe_2$.

14. The method of claim 11, wherein M is indium (In) that is added to the precursor comprising $CuSe_2$ at greater than or equal to about 0.5 mol. % to less than or equal 10 mol. %.

15. The method of claim 14, wherein indium (In) is added to the precursor comprising $CuSe_2$ at about 1 mol. %.

16. The method of claim 11, wherein the converting is a sequential solid-state transformation of the precursor, wherein M is indium (In) that is added to the precursor comprising $CuSe_2$ in a ball mill under an inert atmosphere to generate $CuInSe_2$, and the reagent metal (M') comprises elemental copper (Cu) added to convert remaining copper diselenide ($CuSe_2$) to copper selenide ($Cu_2Se$) to form a product comprising a mixed powder comprising copper selenide ($Cu_2Se$) and copper indium selenide ($CuInSe_2$).

17. The method of claim 16, wherein mixed powder is removed from the ball mill and compressed into high density pellets.

* * * * *

UNITED STATES PATENT AND TRADEMARK OFFICE
CERTIFICATE OF CORRECTION

| | |
|---|---|
| PATENT NO. | : 10,892,396 B2 |
| APPLICATION NO. | : 16/445891 |
| DATED | : January 12, 2021 |
| INVENTOR(S) | : Pierre Ferdinand Poudeu-Poudeu et al. |

Page 1 of 1

It is certified that error appears in the above-identified patent and that said Letters Patent is hereby corrected as shown below:

In the Specification

Column 1, Line 15:
Delete "This invention was made with government support under DE-SC0008574 awarded by the Department of Energy. The Government has certain rights in the invention." and insert --This invention was made with government support under DE-SC0008574 and DE-SC0018941 awarded by the U.S. Department of Energy. The government has certain rights in the invention.--

Signed and Sealed this
Twenty-second Day of October, 2024

Katherine Kelly Vidal
*Director of the United States Patent and Trademark Office*